United States Patent [19]

Weinberger

[11] 4,087,811
[45] May 2, 1978

[54] THRESHOLD DECODER

[75] Inventor: Arnold Weinberger, Poughkeepsie, N.Y.

[73] Assignee: International Business Machines Corporation, Armonk, N.Y.

[21] Appl. No.: 661,191

[22] Filed: Feb. 25, 1976

[51] Int. Cl.² .............................................. G06F 5/00
[52] U.S. Cl. .............................. 340/347 DD; 235/310
[58] Field of Search ..... 340/347 DD, 172.5, 347 DA, 340/347 M; 235/154

[56] References Cited

U.S. PATENT DOCUMENTS

| 3,217,147 | 11/1965 | Chapman | 235/154 |
| 3,506,815 | 4/1970 | Stone | 340/347 DD |
| 3,576,562 | 4/1971 | Sakic | 340/347 DD |
| 3,618,047 | 11/1971 | Hertz | 340/347 DD |
| 3,925,780 | 12/1975 | Van Voorhis | 340/347 DD |
| 4,016,555 | 4/1977 | Tyrrel | 340/347 DA |

Primary Examiner—Charles D. Miller
Attorney, Agent, or Firm—Robert W. Berray

[57] ABSTRACT

Disclosed is a decoder which receives a number of coded binary-weighted input signals and which provides, on a plurality of output signal lines, a threshold related to the coded value of the input signals. The threshold is defined at the output as a consecutive sequence of output signal lines having a binary 0 value on one side of the threshold, and a consecutive sequence of output signals on the other side of the threshold having a binary value of 1. In one embodiment, a single level of binary logic receives $n$ input signals and produces a threshold on $m = 2^n - 1$ output signal lines. A second embodiment receives $n$ input signals which are divided into groups of signals, each group of which is applied to an intermediate threshold generator, the outputs of which are combined in a final level to provide $m$ output signals. A further embodiment of the threshold decoder receives two groups of input signals which are combined in a first level of intermediate threshold generators, the outputs of which are then combined in a final stage which may produce more than one threshold on the output signal lines. Another further embodiment of the threshold decoder discloses a plurality of groups of input signal lines, combined in a plurality of intermediate threshold generators, the outputs of which are combined in a final level of logic to produce, selectively, a like plurality of thresholds on the output signal lines.

6 Claims, 24 Drawing Figures

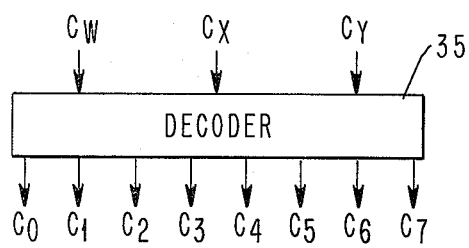

FIG.1

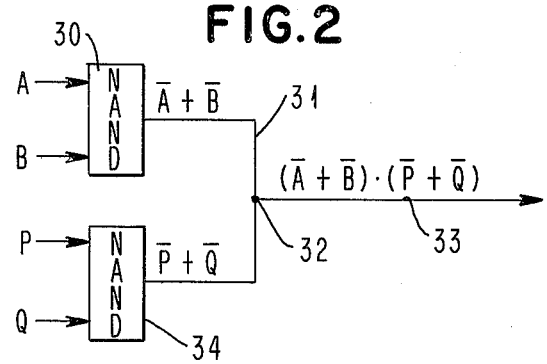

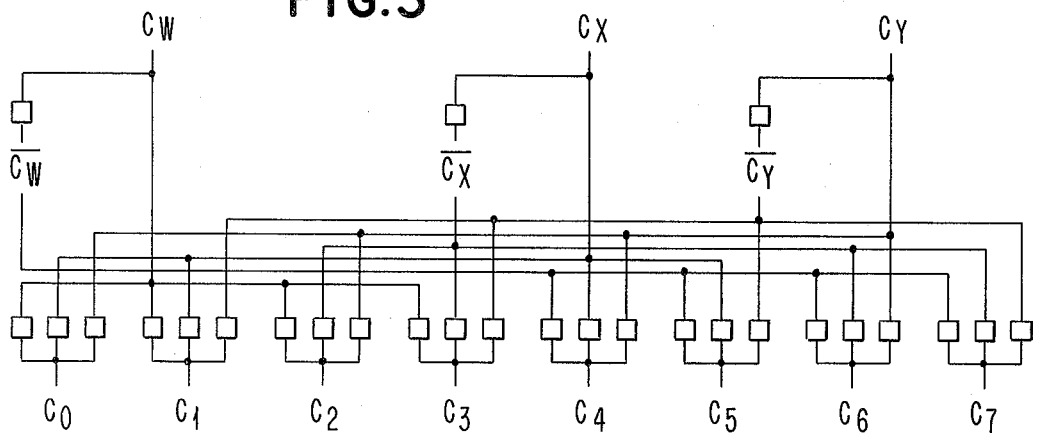

FIG.4

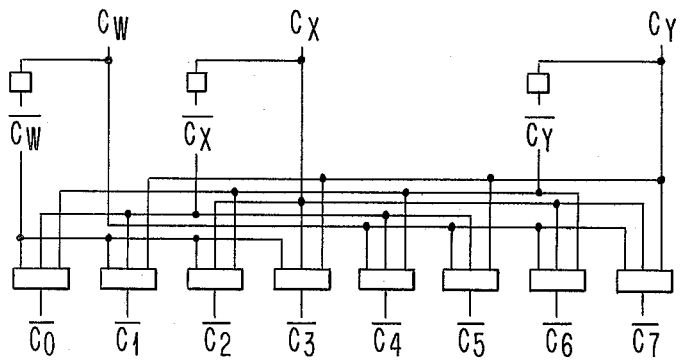

| 4 2 1 $C_W$ $C_X$ $C_Y$ | TRUE DECODE OUTPUTS | COMPLEMENT DECODE OUTPUTS | |
|---|---|---|---|
| 0 0 0 | $C_0 = \overline{C_W} \cdot \overline{C_X} \cdot \overline{C_Y}$ | $\overline{C_0} = C_{1-7}$ | $= C_W + C_X + C_Y$ |
| 0 0 1 | $C_1 = \overline{C_W} \cdot \overline{C_X} \cdot C_Y$ | $\overline{C_1} = C_{0,2-7}$ | $= C_W + C_X + \overline{C_Y}$ |
| 0 1 0 | $C_2 = \overline{C_W} \cdot C_X \cdot \overline{C_Y}$ | $\overline{C_2} = C_{0-1,3-7}$ | $= C_W + \overline{C_X} + C_Y$ |
| 0 1 1 | $C_3 = \overline{C_W} \cdot C_X \cdot C_Y$ | $\overline{C_3} = C_{0-2,4-7}$ | $= C_W + \overline{C_X} + \overline{C_Y}$ |
| 1 0 0 | $C_4 = C_W \cdot \overline{C_X} \cdot \overline{C_Y}$ | $\overline{C_4} = C_{0-3,5-7}$ | $= \overline{C_W} + C_X + C_Y$ |
| 1 0 1 | $C_5 = C_W \cdot \overline{C_X} \cdot C_Y$ | $\overline{C_5} = C_{0-4,6-7}$ | $= \overline{C_W} + C_X + \overline{C_Y}$ |
| 1 1 0 | $C_6 = C_W \cdot C_X \cdot \overline{C_Y}$ | $\overline{C_6} = C_{0-5,7}$ | $= \overline{C_W} + \overline{C_X} + C_Y$ |
| 1 1 1 | $C_7 = C_W \cdot C_X \cdot C_Y$ | $\overline{C_7} = C_{0-6}$ | $= \overline{C_W} + \overline{C_X} + \overline{C_Y}$ |

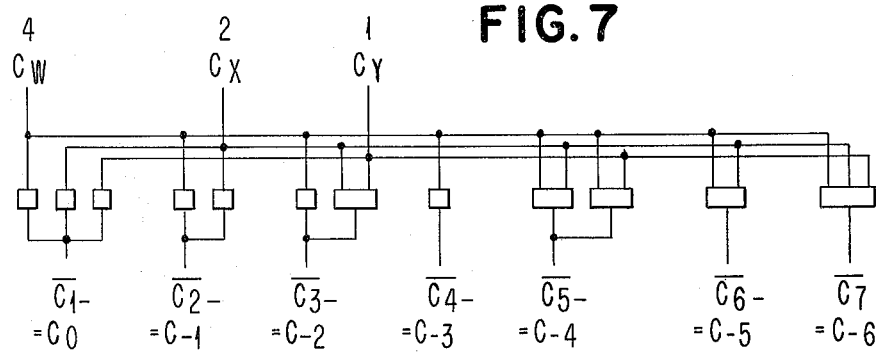

FIG. 8

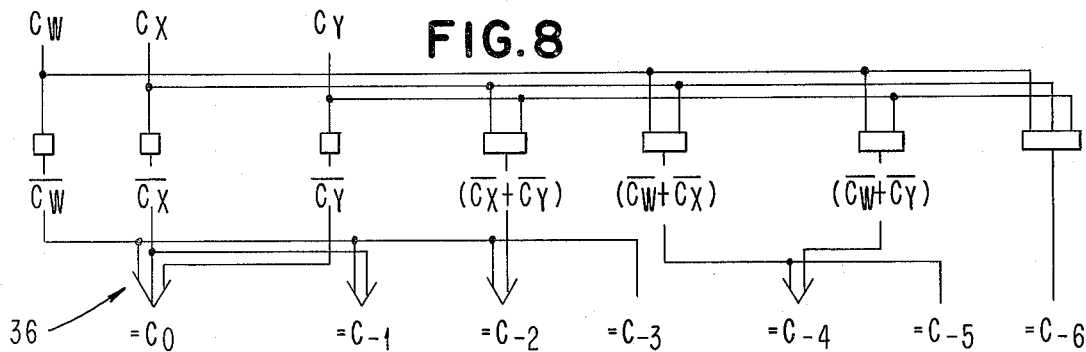

FIG. 9

$\overline{(C \geq 1)} = (C < 1) = (C = 0) = C_0 \qquad = C_0 = \overline{C_W} \cdot \overline{C_X} \cdot \overline{C_Y}$ $\overline{(C \geq 2)} = (C < 2) = (C \leq 1) = C_0 + C_1 \qquad = C_{-1} = \overline{C_W} \cdot \overline{C_X}$ $\overline{(C \geq 3)} = (C < 3) = (C \leq 2) = C_0 + C_1 + C_2 \qquad = C_{-2} = \overline{C_W} \cdot (\overline{C_X} + \overline{C_Y}) = \overline{C_W} \cdot \overline{C_X} + \overline{C_W} \cdot \overline{C_Y}$ $\overline{(C \geq 4)} = (C < 4)\ (C \leq 3) = C_0 + C_1 + C_2 + C_3 \qquad = C_{-3} = \overline{C_W}$ $\overline{(C \geq 5)} = (C < 5) = (C \leq 4) = C_0 + C_1 + C_2 + C_3 + C_4 \qquad = C_{-4} = \overline{C_W} + \overline{C_X} \cdot \overline{C_Y} = (\overline{C_W} + \overline{C_X}) \cdot (\overline{C_W} + \overline{C_Y})$ $\overline{(C \geq 6)} = (C < 6) = (C \leq 5) = C_0 + C_1 + C_2 + C_3 + C_4 + C_5 \qquad = C_{-5} = \overline{C_W} + \overline{C_X}$ $\overline{(C \geq 7)} = (C < 7) = (C \leq 6) = C_0 + C_1 + C_2 + C_3 + C_4 + C_5 + C_6 = C_{-6} = \overline{C_W} + \overline{C_X} + \overline{C_Y}$

FIG. 10

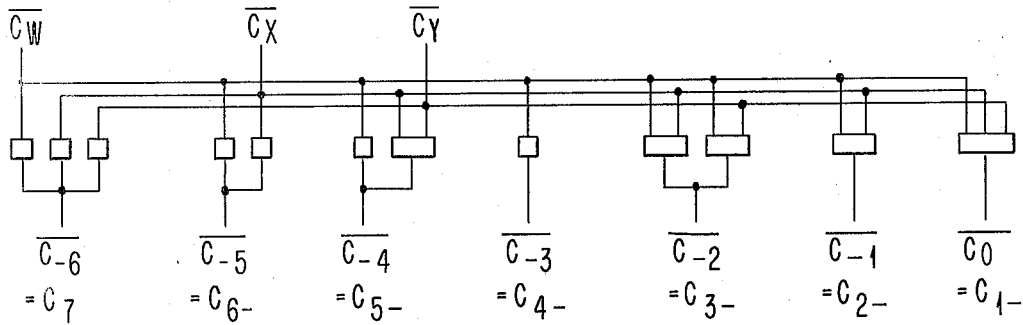

FIG.11

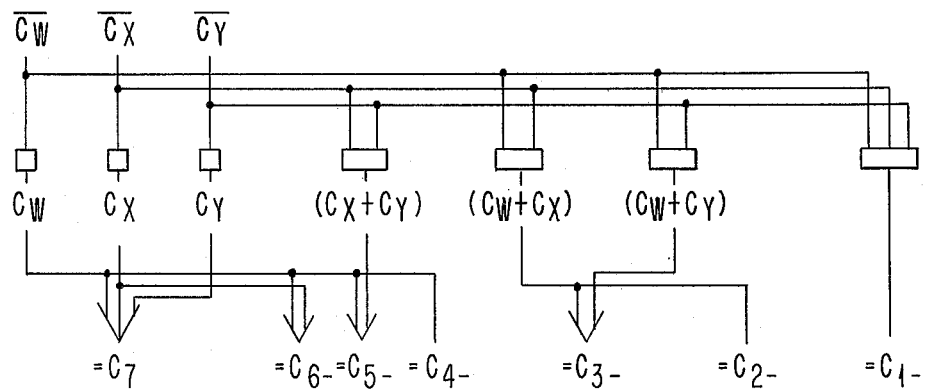

FIG.12

$(C \geq 1) = C_1 + C_2 + C_3 + C_4 + C_5 + C_6 + C_7 = C_{1-} = C_W + C_X + C_Y$ $(C \geq 2) = \phantom{C_1 +} C_2 + C_3 + C_4 + C_5 + C_6 + C_7 = C_{2-} = C_W + C_X$ $(C \geq 3) = \phantom{C_1 + C_2 +} C_3 + C_4 + C_5 + C_6 + C_7 = C_{3-} = C_W + C_X \cdot C_Y = (C_W + C_X) \cdot (C_W + C_Y)$ $(C \geq 4) = \phantom{C_1 + C_2 + C_3 +} C_4 + C_5 + C_6 + C_7 = C_{4-} = C_W$ $(C \geq 5) = \phantom{C_1 + C_2 + C_3 + C_4 +} C_5 + C_6 + C_7 = C_{5-} = C_W \cdot (C_X + C_Y) = C_W \cdot C_X + C_W \cdot C_Y$ $(C \geq 6) = \phantom{C_1 + C_2 + C_3 + C_4 + C_5 +} C_6 + C_7 = C_{6-} = C_W \cdot C_X$ $(C \geq 7) = (C = 7) \phantom{C_1 + C_2 + C_3 + C_4 + C_5 + C_6 +} C_7 = C_7 = C_W \cdot C_X \cdot C_Y$

FIG.22

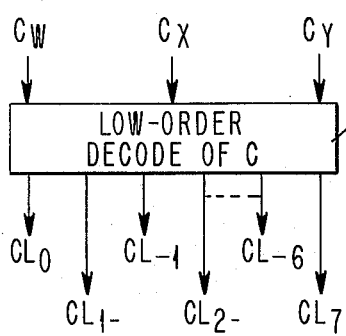

FIG.23

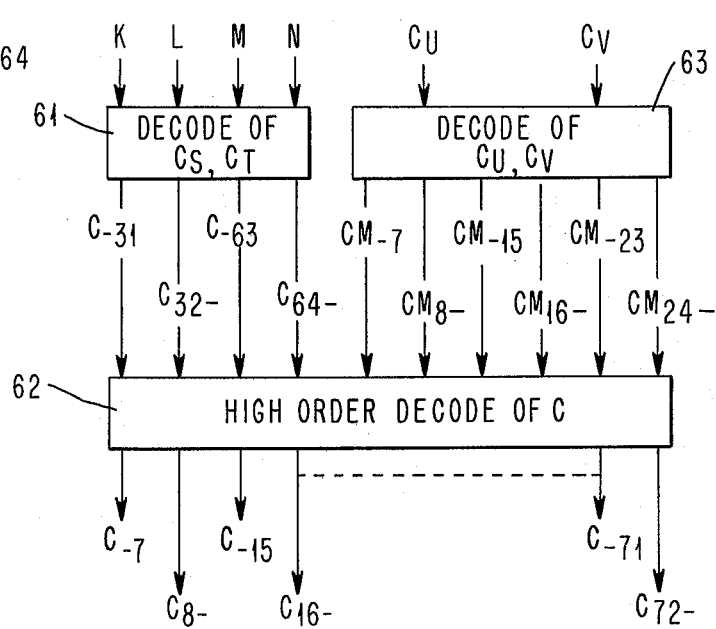

FIG.14
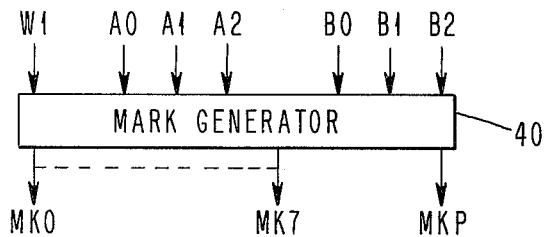
FIG.15
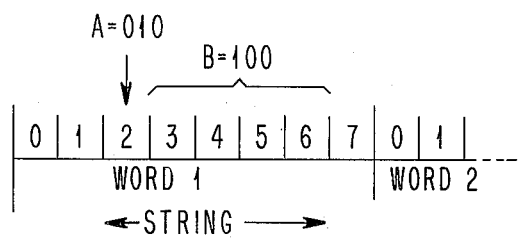
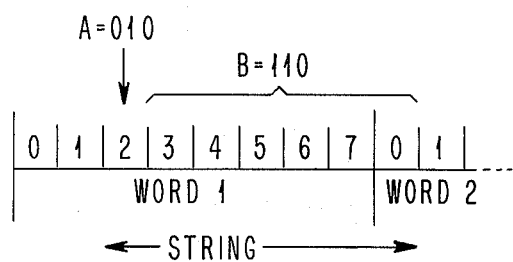
FIG.16
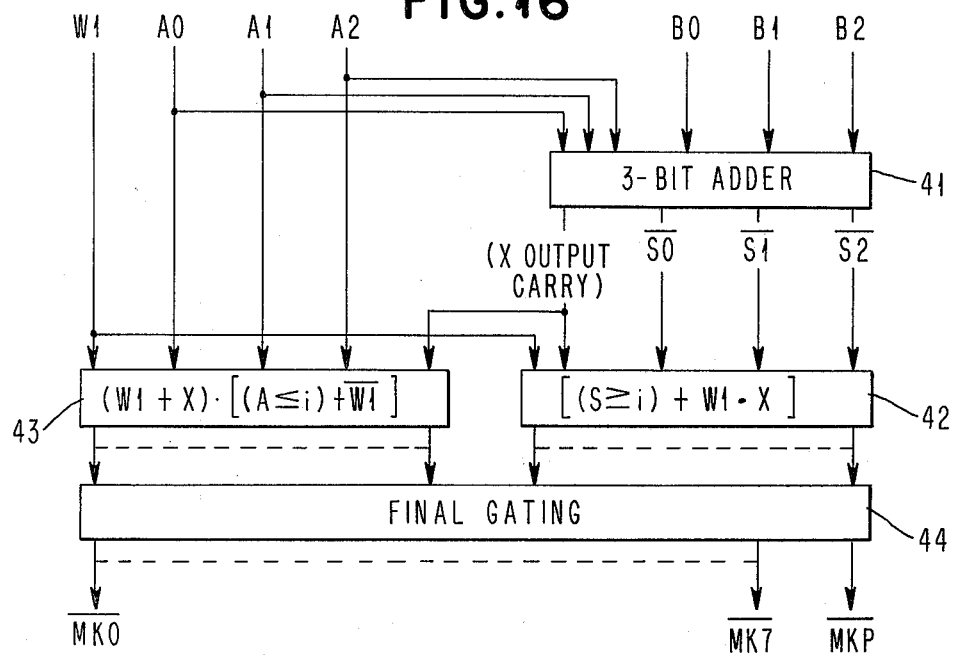

THRESHOLD DECODER

FIELD OF INVENTION

This invention relates to binary data handling apparatus, and more particularly to apparatus referred to as a decoder which receives coded binary-weighted values and produces an output related to the value.

BACKGROUND OF THE INVENTION

Commonly assigned U.S. Pat. No. 3,603,776 entitled "Binary Batch Adder Utilising Threshold Counters" provides a summary of the operation and function of binary logic referred to as encoders and decoders. This generally refers to a binary data processing function in which the binary 1 or binary 0 state of a plurality of signal lines representing binary values 1, 2, 4, etc. are related to the binary 1 or binary 0 state of a particular one of other signals lines. An encoder will receive the binary 1 state of a particular one of several input signal lines and provide a coded binary-weighted output on several signal lines each of which represents a particular binary weight. On the other hand, a decoder receives a coded binary-weighted value on a plurality of input signal lines and energizes a particular one of a number of output signal lines.

There are a number of binary data processing functions in which a requirement exists for responding to coded, binary-weighted signals on a plurality of input lines to provide enabling or disabling signals to a plurality of consecutive ones of a sequence of gates. Such a function is required in parallel, binary shifting, wherein a specified number of bit positions at one end or the other of a binary word are to be enabled or disabled to provide a proper shift operation. Also, other data processing functions require that a field of data within a larger group of data be identified to participate in a particular data processing function.

In prior art data processing operations requiring the above mentioned functions, a coded, binary-weighted value would be applied to a decoder in which the logic would respond to the binary-weighted value to provide energization of a particular one of a plurality of output lines related to the value coded. Further logic, or circuitry, would be required to respond to the particular line energized to ultimately enable the consecutive ones of the gates required to identify a field or bit positions to be enabled or blocked in a shifter.

SUMMARY OF THE INVENTION

The present invention discloses and claims a threshold decoder. A threshold decoder is defined as a binary data handling apparatus which receives, in one embodiment, $n$ input signal lines coded with binary-weighted values, to produce at the output on $2^n - 1$ output signal lines, a threshold defined by the value represented by the coding of the binary-weighted input signal lines. The threshold related to the value coded on the input signal lines is manifested by the fact that those of the output signal lines on one side of the threshold will have one binary state (1), and those of the output signal lines on the other side of the threshold will have the other binary state (0).

An extension of the inventive concept discloses a threshold decoder which receives coded binary-weighted values related to the beginning and ending of a field of data within a larger group, for conditionally providing more than one threshold at the output of the threshold decoder. An additional embodiment is disclosed in which the threshold decoder receives a plurality of coded binary-weighted values for selectively providing a like plurality of thresholds. The logic of the threshold decoding is simplified by recoding and combining high order binary bits of each of the codes to reflect the fact that if one of the weighted codes has a particular value, subsequent ones of the codes cannot have certain values.

It is therefore an object and feature of the present invention that consecutive ones of a plurality of output signal lines of a decoder can be energized to a binary 1 or a binary 0 state directly from logic responding to input signal lines energized in accordance with coded, binary-weighted values, without an intermediate step of providing energization of a particular one of a plurality of lines, each associated with a particular value represented by the coded input.

BRIEF DESCRIPTION OF DRAWINGS

FIG. 1 depicts a decoder showing inputs and outputs.

FIG. 2 depicts the NAND/dot-AND logic utilized throughout the description.

FIG. 3 shows the logic of a prior art decoder providing true signal outputs.

FIG. 4 shows the logic of a prior art decoder with complement signal outputs.

FIG. 5 is a truth table of the logic shown in FIG. 3.

FIG. 6 is a truth table of the logic shown in FIG. 4.

FIG. 7 shows the logic of the present invention for generating a threshold output in true form.

FIG. 8 shows the logic of another form of the present invention providing a threshold with true outputs.

FIG. 9 is a truth table representing the logic of FIGS. 7 and 8.

FIG. 10 is a logic showing of the threshold decoder of the present invention in which the threshold outputs are in complement form.

FIG. 11 is another representation of the logic of a threshold decoder providing outputs in complement form.

FIG. 12 is a truth table of the logic shown in FIGS. 10 and 11.

FIG. 14 is a representation of the use of the threshold generator of the present invention for field selection.

FIG. 15 shows two examples of field selection in which the starting and ending point of the field are designated by coded binary-weighted values, in which the ending of the field may extend into a further group of data to complete a field.

FIG. 16 is a block diagram of the threshold decoder utilized for field selection.

FIG. 21 is a block diagram of a threshold decoder utilized for bit steering in which four separate coded binary-weighted values are specified.

FIG. 22 is a block representation of the inputs and outputs of a threshold decoder of low order bits of a coded binary weighted value utilized in FIG. 21.

FIG. 23 is a block diagram showing the inputs and outputs of a threshold decoder for high order bits of a coded binary-weighted value utilized in FIG. 21.

DETAILED DESCRIPTION OF INVENTION

Conventional Decoder

Figure 13:
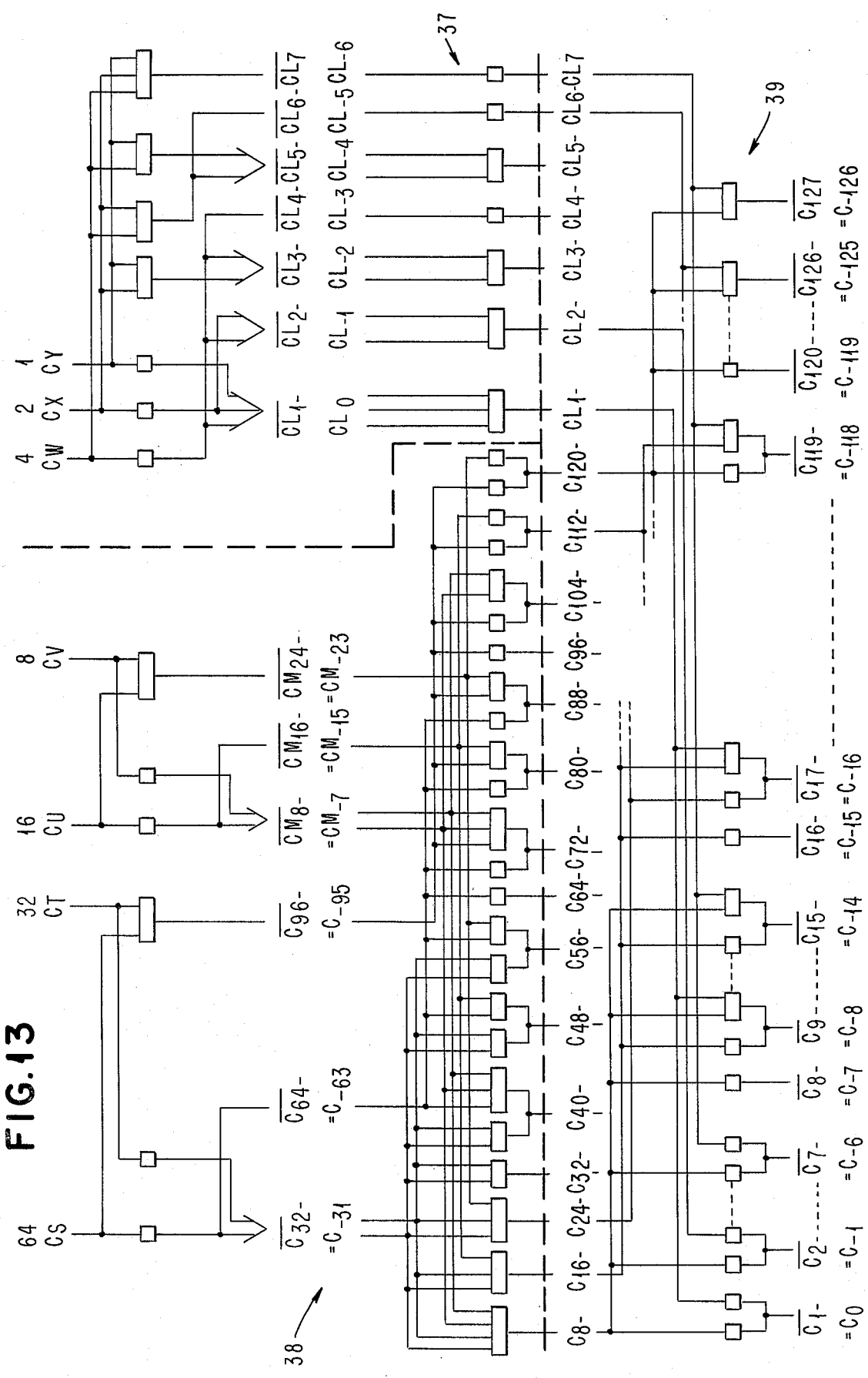
FIG. 13 is the logic of a threshold decoder comprised of intermediate threshold generators, each receiving a group of the input signal lines representing the coded binary-weighted value.

FIGS. 1 through 6 will be utilized to describe conventional decoder operations. Throughout the description which follows, the logic shown in FIG. 2 will be utilized unless otherwise specified. This logic is identified as NAND/dot-AND logic. Positive and negative levels of inputs will be utilized to represent binary 1 and binary 0 respectively. Throughout the description and drawings, the letter symbols, for example, $\overline{A}$, signifies that a positive or binary 1 level will be produced when A is true or present. The symbol $\overline{A}$ is referred to as the "NOT" or "Complement" state of the signal represented and will be positive or at the binary 1 level when A is false or not present. The symbol (+) represents an OR function, and the symbol (.) represents an AND function.

In FIG. 2, the NAND circuit 30 receives inputs A and B and provides the logical function output shown. As depicted, the output signal line 31 will be at a negative level if both A and B are at a positive level. Stated alternatively, as shown in the representation of FIG. 2, if either A or B are at a negative level at the input to the NAND circuit 30, the output signal line 31 will be at a positive level. The dot-AND function shown at 32 represents a situation in which the output signal line 33 will be at a positive level only if both NAND circuit 30 and NAND circuit 34 each have at least one input signal at a negative, NOT, or Complement level. Throughout the remainder of the drawings, a rectangle will be considered a NAND circuit as shown in FIG. 2 unless otherwise identified.

FIG. 1 illustrates a 3-bit decoder 35. The 3-bit input may be thought of as a 3-bit integer. Each bit is identified with a unique subscript, W, X and Y. A weight is assigned to each bit to correspond to its position in the integer. Thus $C_W$ is assigned weight 4, meaning that it has a value 4 if it is logically 1 (i.e., it is on) and a value 0 if it is logically 0 (i.e., it is off). The next bit, $C_X$ has a value 2 if it is on and 0 if off. Finally, $C_Y$ has a value 1 if on and 0 if off. FIG. 3 shows the logic, and FIG. 5 the truth table of, all eight possible combinations of 1/0 (on/off) conditions of the three input bits. They correspond to the eight possible values of the 3-bit integer. As a result, the decode outputs can be labeled accordingly, $C_0$ through $C_7$, meaning that the decode output signal is on if the input bits represent the corresponding integer value and it is off otherwise.

As depicted in the logic of FIG. 4 and the truth table of FIG. 6, the complement decode signals, $\overline{C_0}$ through $\overline{C_7}$, represent all integer values other than the one represented by the true decode signal. For example, $\overline{C_5}$ represents the integer values 0 through 4 and 6 through 7, meaning that $\overline{C_5}$ is on if the input bits represent integer values 0, 1, 2, 3, 4, 6 or 7 and that $\overline{C_5}$ is off for the integer value 5.

Also note that if the inputs are in complement form (i.e., $\overline{C_W}$, $\overline{C_X}$ and $\overline{C_Y}$), the logic structure of FIGS. 3 and 4 remain intact. The decode outputs are simply relabeled, with the subscripts in reverse order, i.e. 0 becomes 7, 1 becomes 6, . . ., and 7 becomes 0.

Threshold Decoder

In the present invention, the decoder depicted in FIG. 1 is provided with logic in accordance with the invention to provide a new decoder to be identified as a threshold decoder or generator. The threshold decoder of the present invention continues to receive coded, binary-weighted values represented on the input signal line of $C_W$, $C_X$, and $C_Y$ to provide output signals on the lines C0 through C7. As distinguished from a conventional decoder, the present invention generates at the output of the decoder 35, a threshold related to the value represented by the input signal lines. The threshold is related to the integer value of the input signal lines, and is identified by the fact that those of the output signal lines C0 through C7 on one side of the threshold will have one binary state (0 or 1), and those of the output signal lines on the other side of the threshold will have the other binary state (0 or 1).

FIGS. 7 through 13 will be utilized to describe the basic form of the present threshold decoder invention.

The threshold decoder generates output signals each of which includes all integer values beginning with a specified threshold value. For the 3-bit input integer of FIG. 1, seven threshold decode signals are useful. The generation of complement threshold outputs is depicted in FIGS. 7 through 9, and true outputs in FIGS. 10 through 12. The true threshold decode signal, $C \geq 0$, is logically 1 (i.e. is on) for all integer values of the inputs and, therefore, does not need to be generated.

Note that the true threshold notation, $C \geq i$, is replaced with the abbreviated subscripted notation, $C_{i-}$ (i.e. $i$ or greater with the exception of $C_7$ for which $C_{7-}$ is superfluous).

FIGS. 7, 8, 10 and 11 illustrate several methods of implementing the threshold decoder using the truth tables of FIGS. 9 and 12. FIG. 7 shows the true input signals generating the 7 complement threshold decode signals with a maximum load of 8 on the inputs (however, there are unequal loads on the inputs). FIG. 8 shows a different version in which the number of gates is reduced, thereby reducing (and evening out) the loads on the inputs to four. This is done, however, at the expense of sharing some of the gate outputs among two or more threshold outputs. For example, the gate output, $\overline{C_W}$ represents $C_{-3}$ and it is also one of the signals of the AND bundles representing $C_0$, $C_{-1}$, and $C_{-2}$. (An AND bundle, such as at 36, is a set of signals which, when ANDed, represent the specified logic function. It is used to reduce the number of gates by sharing gate outputs.) Between the extremes of FIGS. 7 and 8, other implementations are possible in which a limited amount of signal sharing is used. For example, an extra gate generating $\overline{C_W}$ may be added whose output is dotted with $\overline{C_X}$ to produce $\overline{C_W} \cdot \overline{C_X}$ which can be used as $C_{-1}$ as well as one signal in an AND bundle for $C_0 = (\overline{C_W} \cdot \overline{C_X}) \cdot (\overline{C_Y})$. This adds one load to the input $\overline{C_W}$ but reduces the participation of the single gate output $\overline{C_W}$ from four to two threshold outputs. If the inputs of FIGS. 7 and 8 are in complement form, the outputs are the true threshold decode signals, as shown in FIGS. 10 and 11.

Threshold Decoding By Parts

As the number of coded binary-weighted inputs to a conventional decoder increases, the load on the inputs, that is, the number of logic circuits to which an input is applied, and the resulting delay becomes excessive. As is already known, it becomes more efficient to implement a decoder in two or more stages. The input bits are partitioned into two or more groups with a few bits each, and independently decoded. The intermediate results of the independent decoded groups of input bits are then combined in one or more stages to produce the desired final decode output.

Threshold decoding by dividing the input signal lines into groups of lines, and providing intermediate threshold signal outputs, is shown in FIG. 13. In FIG. 13, seven inputs ranging in binary value of 1 to a binary value of 64, are partitioned into three parts: the upper two bits ($C_S$, $C_T$), middle two bits ($C_U$, $C_V$), and the low order three bits ($C_W$, $C_X$, $C_Y$).

The threshold decoder of FIG. 13 is comprised generally of a first intermediate threshold generator 37, receiving the three low order binary-weighted input signals, a second intermediate threshold generator 38 receiving the four high order binary-weighted input signals and a final level of logic circuits 39, receiving the threshold signal outputs of intermediate threshold generators 37 and 38, for providing a final threshold signal output in accordance with the total weight of the coded binary-weighted value on the input signal line.

The low order 3-bit intermediate threshold decoder 37 can be implemented according to the truth tables shown in FIGS. 9 or 12, depending on whether true or complement threshold functions are desired. (The logic of FIG. 8 has been depicted in FIG. 13). The notation now includes the added letter L to represent the set of integer values selected among from 0 through 127 instead of only from 0 through 7.

Similarly, the second intermediate threshold generator 38 follows the truth tables shown in Table I and Table II for the decoding of the inputs $C_S$, $C_T$ and middle two bits $C_U$, $C_V$ respectively. (All of the tables referred to are found at the end of the specification labeled as Appendix A.) Both true and complement outputs have been shown in the tables.

The truth table and logic required for the threshold signal output of intermediate threshold generator 38 is shown in Table III.

Field Definition Threshold Decoder

Binary data within a data processing system, whether stored in a main memory or utilized within the data flow of a central processing unit, is often identified as a word of data. The word of binary data, as a unit in itself, may be comprised of a number of subunits, and may be defined as an individual binary bit, a binary coded decimal (BCD) digit, or an 8-bit byte. Many functions within the data processing system require the definition of a field in one or more of the binary data words, which field may be defined by identifying a first subunit within the word, and by specifying the number of subunits to be included within the field.

One form of field definition, to be discussed more fully in accordance wth the present invention, is the requirement to generate mark bits found in IBM System/360 and IBM System/370. Mark bits are generated to define particular ones of a plurality of eight bit bytes within a binary word stored in a main storage device. The particular bytes defined are those which are to be modified when storing information into a data word addressed in the main storage device. A particular mark bit, which has not been energized, will prevent any modification from taking place when storing into an addressed word.

FIGS. 14 through 17 will be utilized to describe the implementation of the threshold generator of the present invention into binary data handling apparatus utilized for mark bit generation.

FIG. 14 is a general block diagram showing the various inputs and outputs of a mark generator implemented in accordance with the present invention. FIG. 15 shows two examples in which mark bits are generated to define a field within two consecutive binary words stored in two consecutive addresses of the main storage device.

Referring to FIG. 14, the mark generator 40 generates a string of binary 1's called mark bits beginning with a specified mark bit position and continuing for a specified length. In FIG. 14, we assume eight mark bit positions labelled MK0 through MK7. The string of mark bits begins at one of the eight mark bit positions specified by a 3-bit number (A) while number (B) specifies how many 1's follow the initial 1 in the string.

As shown in FIG. 15, when (A0, A1, A2) are 010 and (B0,B1,B2) are 100, the string of 1's begins with MK2 and continues for four additional mark bit positions, so that the string of 1's is MK2 through MK6. MK0, MK1, and MK7 are 0's.

A different case occurs when A and B specify a string of 1's which overflows the 8-bit word of mark bit positions. For example, when (A0,A1,A2) are 010 and (B0,B1,B2) are 110, the string of 1's begins with MK2 and continues for six additional mark bit positions, so that the string of 1's is MK2 through MK7 with an additional one overflowing into a second word of mark bit positions also labeled MK0 through MK7. The second word therefore consists of a 1 in MK0 and 0's in MK1 through MK7. (MK7 of the second word is always 0 since the longest string is eight 1's and begins at least with MK7 of the first word.)

Only one word of mark bit positions is generated at any one time, either word 1 or the overflow word 2, as specified by the input signal W1 (1 for word 1, 0 for word 2). A mark parity bit, MKP, is also generated for each 8-bit word.

In the examples of FIG. 15, the threshold decoder implemented as a mark generator may be required to operate in two separate cycles to handle the mark bit generation for word one or word two. Further, the output of the threshold decoder may define a single threshold in either of the two cycles (example 2) where one threshold is created between MK1 and MK2 for word 1 and another threshold is created between MK0 and MK1 in word 2. Further, as shown in example 1, the threshold decoder implemented as a mark generator may create two thresholds. In example 1, where no overflow occurs into word 2, a threshold is shown as being created between MK1 and MK2, and another threshold created between MK6 and MK7.

The implementation of the function of FIG. 14 using the threshold decoder of the present invention is illustrated in block diagram form in FIG. 16. First, the two 3-bit numbers, A and B, are applied to an adder 41 to produce a 4-bit sum. The high order bit is labeled X and represents the output carry of the adder 41. It also corresponds to the condition of overflowing the string of mark bits into the second word ($X=1$) or not overflowing ($X=0$). This follows from the fact that when the sum of A and B equals 8 or more, the string overflows. The low-order three bits of the sum are labeled (S0,S1,S2) with S2 the least significant sum bit. These three sum bits are referred to as S. Next, the two 3-bit numbers, A and S, are applied to intermediate threshold generators 42 and 43 and decoded into intermediate threshold functions, A in complement form and S in true form, i.e. $(A \leq i)$ and $(S \geq i)$ for $i = 0$ through 7. Finally, with appropriate combinations of the intermediate threshold functions of A and S, together with the overflow signal X and control signal W1 in a final gating stage 44, the mark bit threshold outputs are generated.

This method of generating the final threshold output is derived as follows: Each of the mark bit position outputs MK1 ($i=0, \ldots, 7$), will be logically 1 if either of the following two conditions occur:

1. The first word is called for ($W1=1$) and both ($A \leq i$) as well as (4-bit sum$\geq i$). The condition (4-bit sum$\geq i$), in turn means ($S \geq i$) or overflow occurs ($X=1$).
2. The second word is called for ($W1=0$), overflow occurs ($X=1$) and ($S \geq i$). In equation form, $MK1 = W1 \cdot (A \leq i) \cdot [(S \geq i) + X] + \overline{W1} \cdot X \cdot (S \geq i)$. Using known logic conversion techniques, this converts to:

$$MK1 = (W1+X) \cdot [(A \leq i) + \overline{W1}] \cdot [(S \geq i) + W1 \cdot X].$$

The complement threshold functions of A and the true threshold functions of S are expressed. If the truth table of TABLE IV is substituted into the above equation, the truth table of TABLE V is created. (Note that the term (W1+X) reduces to (W1) for MK7, since MK7 for the second word is always 0). The mark parity bit, MKP, is logically 1 if either of the following four conditions occur:

1. The first word is called for ($W1=1$), no overflow is present ($X=0$), and the length of the string is even ($B2=1$, i.e. B is odd).
2. The first word is called for ($W1=1$), overflow occurs ($X=1$), and the string begins with an even mark bit position ($A2=0$).
3. The second word is called for ($W1=0$) and no overflow occurs ($X=0$).
4. The second word is called for ($W1=0$), overflow occurs ($X=1$), and the length of the string within the second word is even ($S2=1$, i.e., it is equivalent to the sum of A plus B being odd).

These four conditions are expressed as:

$$MKP = W1 \cdot \overline{X} \cdot B2 + W1 \cdot X \cdot \overline{A2} + \overline{W1} \cdot \overline{X} + \overline{W1} \cdot X \cdot S2$$

This is reduced and converted to take advantage of bracketed expressions as follows:

$$MKP = W1 \cdot \overline{X} B2 + W1 \cdot X \cdot \overline{A2} + \overline{W1} \cdot \overline{X} + \overline{W1} \cdot S2$$

$$= W1 \cdot (\overline{W1 \cdot X}) \cdot B2 + W1 \cdot X \cdot [\overline{A2} + \overline{W1}] + (\overline{W1+X}) + \overline{W1} \cdot (S2 + W1 \cdot X)$$

Figure 17:
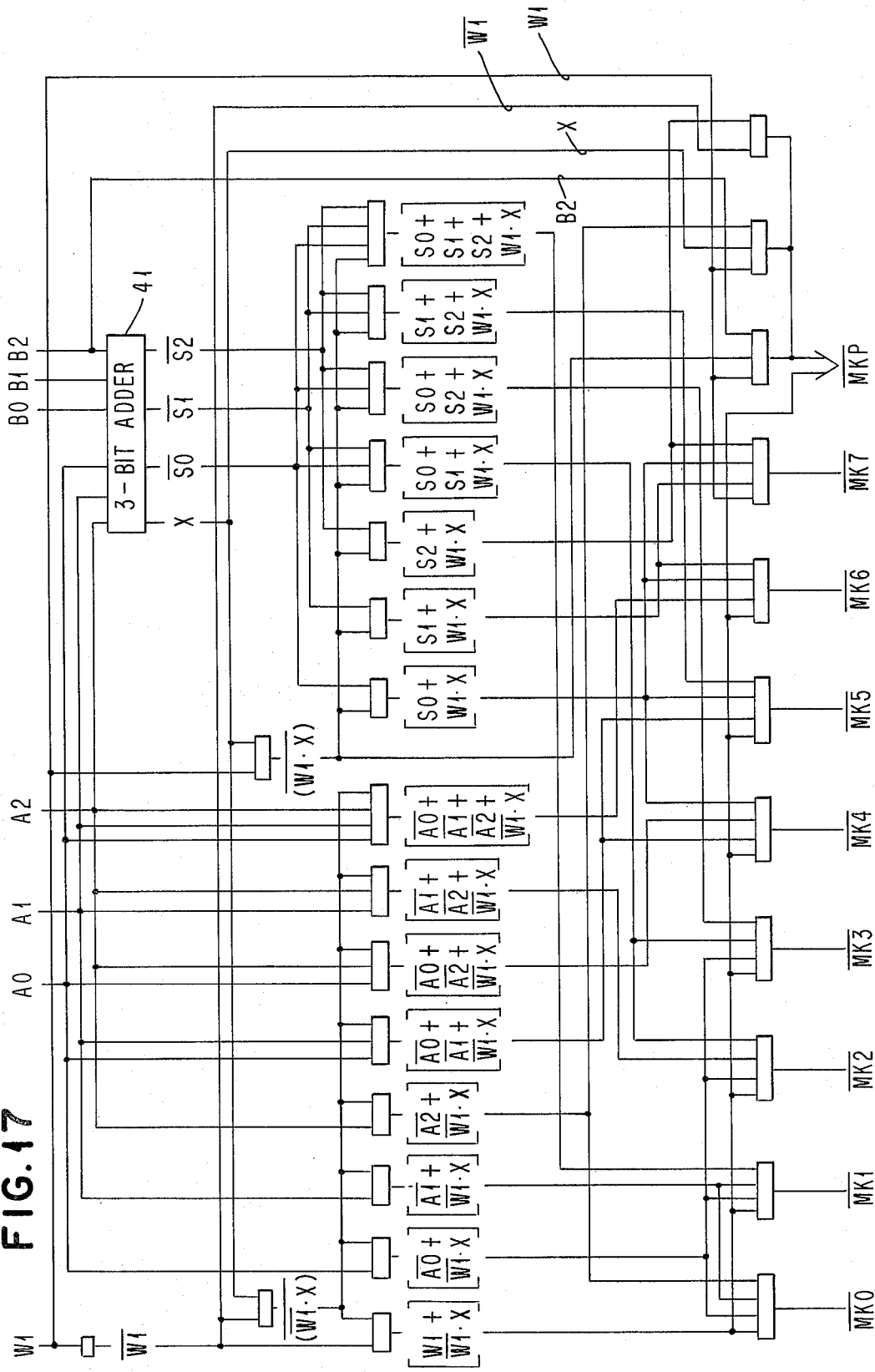
FIG. 17 shows the detailed logic of a threshold decoder utilized for field selection.

FIG. 17 is a detailed logic diagram based on the logic of TABLE V and MKP equation. (The redundant expression $\overline{W1 \cdot X}$ is substituted for $\overline{W1}$ in the threshold expressions for A. Also, ($W1 + \overline{W1} \cdot X$) is substituted for ($W1+X$). A gate is saved by the substitutions.)

Threshold Decoding Steering Network

Another data processing function for which the threshold decoder of the present invention may be adapted is called "bit steering". That is, the steering network will receive at least one binary input signal which must be selectively gated, or steered, to a specified one of a plurality of output lines. A steering network may receive a plurality of input signals which must be steered to a lesser plurality of output signal lines. A first plurality of input signal lines may be steered directly through to corresponding output signal lines. If the next consecutive one input line is inhibited, a next consecutive plurality of input signal lines must be diverted one position. If the next consecutive one input line is inhibited, a next consecutive plurality of input signal lines must be diverted two positions. To form an output of consecutive signal lines, from inputs selectively inhibited and diverted, the desirability of providing a threshold decoder output is apparent.

FIGS. 18 through 24 will be utilized to describe the implementation of the threshold generator of the present invention into binary data handling apparatus accomplishing a bit steering function.

Figure 18:
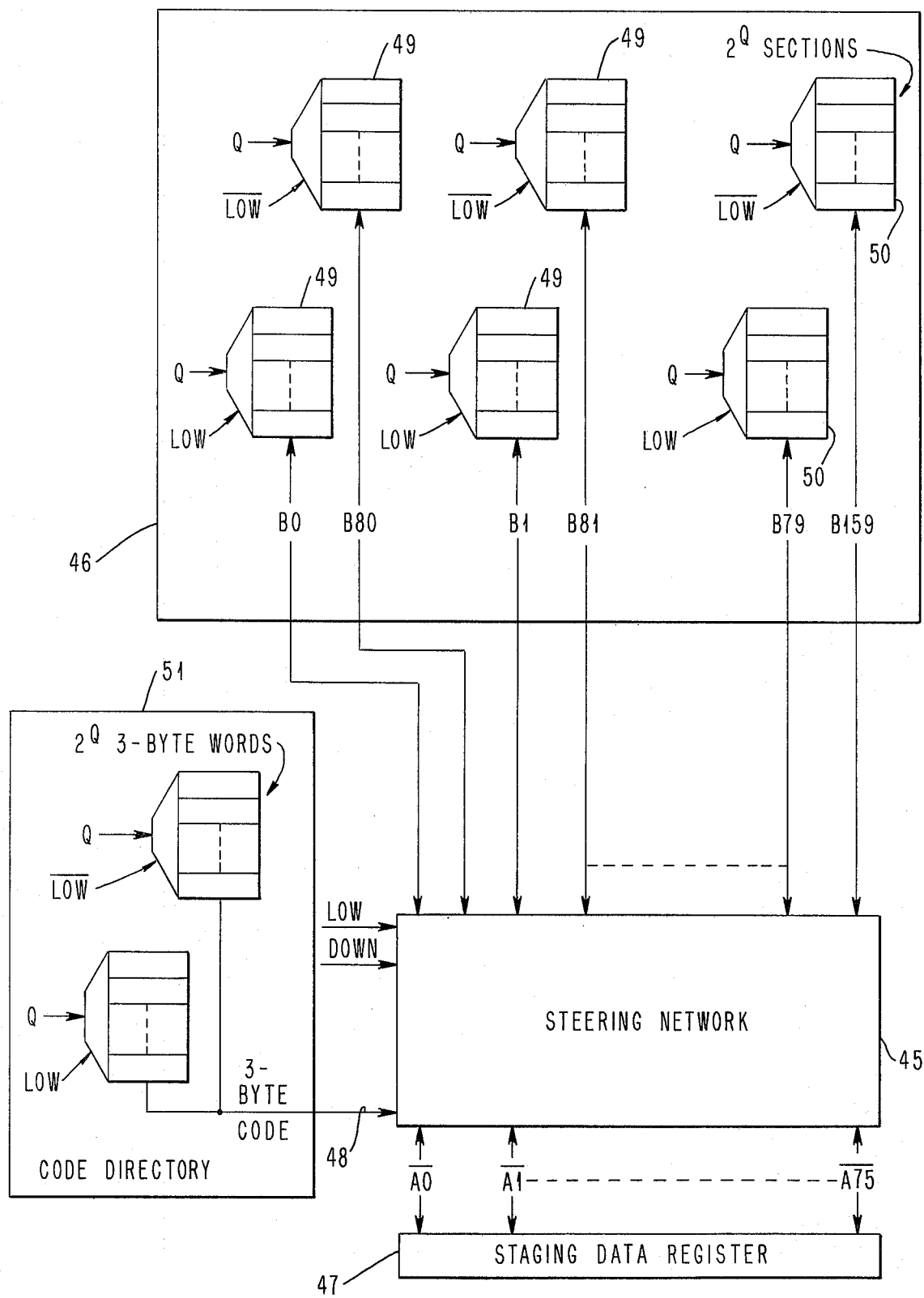
FIG. 18 is an overall block diagram of an embodiment of the threshold decoder of the present invention utilized for gate selection to compensate for defective output lines of a memory system.

In FIG. 18, the steering network 45 is shown and is interposed between 80 sets of parallel data lines of an addressable data store 46, and 76 parallel data lines of a staging data register 47. A 24-bit code applied on line 48 to steering network 45 specifies which 76 of the 80 storage data lines are to be steered to the 76 register lines. The path is bidirectional, i.e., the same 24-bit code specifies which 76 out of the 80 storage lines will the 76 register lines be steered to.

The purpose of the steering network 45 is to provide spare lines at the storage end of the bidirectional path in order to improve the reliability and/or yield of the store 46. FIG. 18 shows where the steering network 45 fits into the system. The store 46 provides two sets of bidirectional lines, labeled B0 through B79 and B80 through B159. During any one cycle, either the low-order or the high order 80 lines may be selected as indicated by the signal lines labeled LOW or $\overline{LOW}$ respectively. Of the selected 80 lines, up to four may be faulty which can be bypassed by means of the steering network 45.

The 160 storage lines B0 through B159 are associated with 160 corresponding portions 49 of store 46. Each portion 49 is further divided logically into $2^Q$ sections 50 that can be addressed by a Q-bit address. The upper as well as the lower sections 50 of store 46 addressed by a particular Q-bit address has a corresponding 3-byte entry in a code directory 51. Each 3-byte entry (24 bits plus three parity bits) specifies the locations of up to four faulty sections 50 of store 46 among the selected sections 50.

When a data transfer takes place between the store 46 and the staging data register 47, the Q-bit address, together with the single bit address labeled LOW, select 80 storage sections 50 in the store 46 as well as a corresponding 3-byte code from the code directory 51. The 3-byte code is decoded in the steering network 45 to steer the data for selecting 76 out of the 80 storage lines. The direction of the data path is controlled by the signal DOWN. When DOWN=1, the direction is store 46 to register 47, when DOWN=0, the direction is register 47 to store 46.

The steering network 45 uses a spare substitution method. Basically, the method works as follows: Of the 80 data lines selected at the store 46, only 76 are used. In the absence of any faulty lines among the first 76 lines, B0 communicates with A0, B1 with A1, ..., and B75 with A75. (The same rule applies if the upper 80 data lines, B80 through B159, are selected, i.e., B80 communicates with A0, B81 with A1, ..., and B155 with A75. For the sake of brevity, only B0 through B79 will be discussed in the examples below.)

Figure 19:
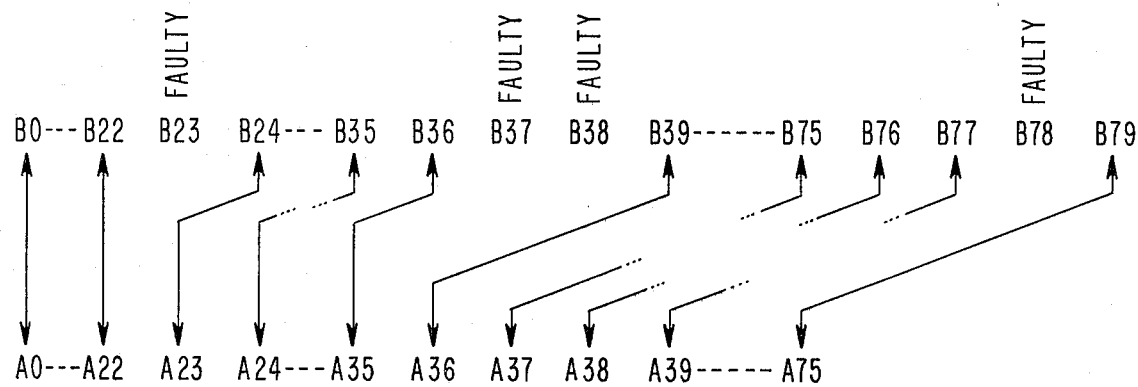
FIG. 19 is a representation of the operation of a threshold decoder in a bit steering environment.

As shown in FIG. 19, one of the first 76 B-lines may be faulty, say B23, then B0 through B22 communicate with A0 through A22, respectively. However, the succeeding B-lines are shifted one bit position to bypass the faulty B23, i.e., B24 communicates with A23, B25 with A24, ..., and B76 with A75. The lines B77 through B79 remain unused.

If two of the first 77 lines are faulty, say B23 and B37, then B0 through B22 communicate with A0 through A22, respectively. B24 through B36 are shifted one bit position to bypass the faulty B23, i.e., B24 through B36 communicate with A23 through A35, respectively. B38 through B77 are shifted two bit positions to bypass the second faulty B-line, B37, i.e., B38 through B77 communicate with A36 through A75, respectively. FIG. 19 illustrates the concept as utilized with four lines are faulty.

An efficient code stored in code directory 51 for identifying up to four faulty lines is selected based on a trade-off between two conflicting requirements:

1. The code should use as few bits as possible to cover the combinations of up to four faulty lines out of 80.
2. The code should be efficiently decodable.

The minimum size code needed to cover the necessary combinations is the sum of the following:

| | | | |
|---|---|---|---|
| $\frac{80 \cdot 79 \cdot 78 \cdot 77}{4 \cdot 3 \cdot 2}$ | $= 1.58 \times 10^6$ | $=$ | number of combinations of 4 faulty lines |
| $\frac{89 \cdot 79 \cdot 78}{3 \cdot 2}$ | $= .08 \times 10^6$ | $=$ | number of combinations of 3 faulty lines |
| $\frac{80 \cdot 79}{2}$ | $= \sim 0$ | $=$ | number of combinations of 2 faulty lines |
| 80 | $= \sim 0$ | $=$ | number of combinations of faulty lines |
| 1 | $= \sim 0$ | $=$ | single case of no faulty lines |
| TOTAL | $= 1.66 \times 10^6$ | $=$ | number of combinations of up to 4 faulty lines |

The total number of combinations can be represented with a code having a maximum of 21 bits. A 24-bit code is actually used, derived from four 7-bit codes identifying the respective four possible faulty B-lines. The high-order two bits of each 7-bit code are compressed into a common set of four bits.

TABLE VI below shows the four 7-bit binary weighted codes C, D, E, and F having bit positions labeled STUVWXY. Code C identifies the location of the first faulty B-line, if any. $C=0$ identifies a faulty B0, $C=1$ a faulty B1, ..., $C=79$ a faulty B79, and $C=80$ identifies the condition of no faulty B-lines. $C > 80$ are illegal combinations.

Code D identifies the location of the second faulty B-line, if any. Since the second faulty B-line must follow the first, B0 cannot be the second faulty B-line. Logic implementation is simplified by coding D such that $D=0$ through 78 identify B1 through B79, respectively, as the second faulty B-line, and D79 identifies the condition of no second faulty B-line. An added restriction is that $D \geq C$, otherwise D is an illegal combination. For example, if $C=25$ identifying B25 as the first faulty line, $D=0$ through 24 are illegal, i.e., B1 through B25 cannot be identified as the second faulty line. Again, $D > 79$ are also illegal combinations.

Code E identifies the location of the third faulty B-line, if any. $E=0$ through 77 identify B2 through B79, respectively, as the third faulty B-line, and $E=78$ identifies the condition of no third faulty B-line, provided $E \geq D$, $E < D$ and $E > 78$ are illegal combinations.

Code F identifies the location of the fourth faulty B-line, if any. $F=0$ through 76 identify B3 through B79, respectively, as the fourth faulty B-line and $F=77$ identifies the condition of no fourth faulty B-line, provided $F \geq E$. $F < E$ and $F > 77$ are illegal combinations.

Illegal combinations of the C, D, E, and F codes can be used as don't care states during logic manipulation.

It should be noted that if the first faulty B-line occurs among B76 through B79, the effect on steering is the same as if no first faulty B-line were present, i.e., B0 through B75 will communicate with A0 through A75, respectively. Similarly, a second faulty B-line occurring among B77 through B79 has the same effect as if no second faulty B-line were present, a third faulty B-line at B78 or B79 has the same effect as if no third faulty B-line were present, and a fourth faulty B-line at B79 has the same effect as if no fourth faulty B-line were present. However, these code combinations (four of C, three of D, two of E, and one of F) are retained as legal combinations in order to help identify the corresponding faulty B-lines for maintenance processing.

The high-order 2 bits of the C, D, E and F codes ($C_S$, $C_T$, $D_S$, $D_T$, etc.) are now compressed into a common set of 4 bits labeled K, L, M, and N, as shown in TABLE VII. Two factors make the compression possible.

1. Only three of the four combinations of the high-order two bits of each code are legal.
2. D may be legal only if $D \geq C$, E may be legal only if $E \geq D$, and F may be legal only if $F \geq E$.

As a result, only 15 combinations of the eight bits are legal, so that they can be represented by the common four bits, K, L, M and N.

In more detail, the two high-order bits of C, $C_S$ and $C_T$, can assume the following three legal combinations:

00 — representing the C-code combinations 0-31 (denoted as $C_{-31}$)

01 — representing the C-code combinations 32-63 (denoted as $C_{32-63}$)

10 — representing the C-code combinations 64-95 (denoted as $C_{64-}$, i.e., $C \geq 64$, since combinations 81-117 are illegal and are used as don't care states.)

The high-order two bits of codes D, E, and F similarly represent these three legal combinations. In addition, when $C_S$ and $C_T$ are 01 (representing $C_{32-63}$), D cannot legally be 00 (representing $D_{-31}$) since only $D \geq C$ may be legal. When all illegal relationships, $D < C$, $E < D$, and $F < E$ are excluded in TABLE VII, only 15 legal combinations remain, and are represented by the 4-bit set K, L, M and N. The KLMN combination 1111 is unused; i.e. illegal.

From table VII also derive the equations for the threshold functions of the C, D, E, and F codes for the legal multiples of 32. As shown in TABLE VIII, the complement threshold function of C, including the combinations 0 through 31 (labeled $C_{-31}$), is derived from the table as $\overline{K} + \overline{L} \cdot \overline{M}$, while the true threshold function of C including the combinations 32 through 127 (labeled $C_{32-}$) is $K \cdot (L+M)$. The complement threshold function including the combinations 0 through 63 (labeled $C_{-63}$), is derived from the sum of $C_{-31} + C_{32-63}$ and expressed as $\overline{K} + \overline{L} + \overline{M}$, while the true threshold function, $C_{64-}$, is $K \cdot L \cdot M$. The threshold functions of multiples of 32 for codes D, E, and F are similarly derived from the table. As will be described, each of the C, D, E, and F codes will be decoded into associated threshold functions to control the steering between B-lines and A-lines.

When transferring data from store 46 to data register 47, the four fault-identifying codes, C, D, E, and F, control the steering of the 80 B-lines into the 76 A-lines in one gate level. However, a total of three gate levels are interposed in the path between B and A. The first level selects between the high-order and the low-order 80 B-lines. The selected set of 80 B-lines, labeled $\overline{B0/80}$ through $\overline{B79/159}$, are then steered into the 76 positions of A by a second gate level. A final level is used for powering to drive into the staging data register 47.

The equations for steering from B to A will be derived via an example. Using the arbitrarily-selected bit position 32, the line $\overline{A32}$ accepts one of the five B inputs, $\overline{B32/112}$ through $\overline{B36/116}$.

1. $\overline{B32/112}$ is steered to $\overline{A32}$ if the first faulty B-line, if any, occurs among B33 (B113) through B79 (B159) i.e. $[C_{33-}]$.
2. $\overline{B33/113}$ is steered to $\overline{A32}$ if the first faulty B-line occurs among B0 (B80) through B32 (B112) and the second faulty B-line, if any, occurs among B34 (B114) through B79 (B159), i.e., $[C_{-32}] \cdot [D_{33-}]$.
3. $\overline{B34/114}$ is steered to $\overline{A32}$ if the second faulty B-line occurs among B1 (B81) thorugh B33 (B113) and the third faulty B-line, if any, occurs among B35 (B115) through B79 (B159), i.e. $[D_{-32}] \cdot [E_{33-}]$.
4. $\overline{B35/115}$ is steered to $\overline{A32}$ if the third faulty B-line occurs among B2 (B82) through B34 (B114) and the fourth faulty B-line, if any, occurs among B36 (B116) through B79 (B159), i.e., $[D_{-32}] \cdot [E_{33-}]$.
5. $\overline{B36/116}$ is steered to $\overline{A32}$ if the fourth faulty B-line occurs among B3 (B83) through B35 (B115), i.e., $[F_{-32}]$. No additional faulty B-lines are considered by the steering network. In equation form:

$$\begin{aligned}\overline{A32} = & \ \overline{B32/112} \ . & & [C_{33-}] \\ & + \overline{B33/113} \ . \ [C_{-32}] & & \cdot \ [D_{33-}] \\ & + \overline{B34/114} \ . \ [D_{-32}] & & \cdot \ [E_{33-}] \\ & + \overline{B35/115} \ . \ [E_{-32}] & & \cdot \ [F_{33-}] \\ & \ \overline{B36/116} \ . \ [F_{-32}] & & \end{aligned} \quad (1)$$

Again, the short notation ($C_{33-}$, $C_{-32}$, etc.) is used to denote the threshold functions of the four codes instead of the more familiar $C \geq 33$, $C \leq 32$, etc. The illegal high-order combinations ($C>80$, $D>79$, $E>78$, and $F>77$) are included in the threshold functions as don't care states.

TABLE IX shows the set of equations for the steering logic of all lines in the direction B to A.

The steering from A to B is similarly controlled in one gate level using the same four fault identifying codes C, D, E and F. Again, three levels are actually interposed in the path from A to B, an inverter level, the steering level, and a final level for both powering and selection between the high-order and low-order 80 B-lines.

Bit position 32 will again be used as an example to derive the steering equations from $\overline{A}$ to B.

The line B32 or B112, labeled $\overline{B32\text{-}112}$ prior to selection between the high order and low order 80 B-lines, accepts one of five A-lines, A32 through A28.

1. A32 is steered to $\overline{B32\text{-}112}$ if the first faulty B-line, if any, occurs among B33 (B113) through B79 (B159), i.e., $[C_{33-}]$.
2. A31 is steered to $\overline{B32\text{-}112}$ if the first faulty B-line occurs among B0 (B80) through B31 (B111) and the second faulty B-line, if any, occurs among B33 (B113) through B79 (B159), i.e., $[C_{-31}] \cdot [D_{32-}]$.
3. A30 is steered to $\overline{B32\text{-}112}$ if the second faulty B-line occurs among B1 (B81) through B31 (B111) and the third faulty B-line, if any, occurs among B33 (B113) through B79 (B159), i.e. $[D_{-30}] \cdot [E_{-31}]$.
4. A29 is steered to $\overline{B32\text{-}112}$ if the third faulty B-line occurs among B2 (B82) through B31 (B111) and the fourth faulty B-line, if any, occurs among B33 (B113) through B79 (B159), i.e., $[E_{-29}] \cdot [F_{-30}]$.
5. A28 is steered to $\overline{B32\text{-}112}$ if the fourth faulty B-line occurs among B3 (B113) through B31 (B111) i.e., $[F_{-28}]$. No additional faulty B-lines are considered by the steering network.

In equation form:

$$\begin{aligned}\overline{B32\text{-}112} = & \ A32 \ . & & [C_{33-}] \\ & + A31 \ . \ [C_{-31}] \ . & & [D_{32-}] \\ & + A30 \ . \ [D_{-30}] \ . & & [E_{31-}] \\ & + A29 \ . \ [E_{-29}] \ . & & [F_{30-}] \\ & + A28 \ . \ [F_{-28}] & & \end{aligned} \quad (2)$$

TABLE X shows the set of equations for the steering logic of all lines A to B.

Figure 20:
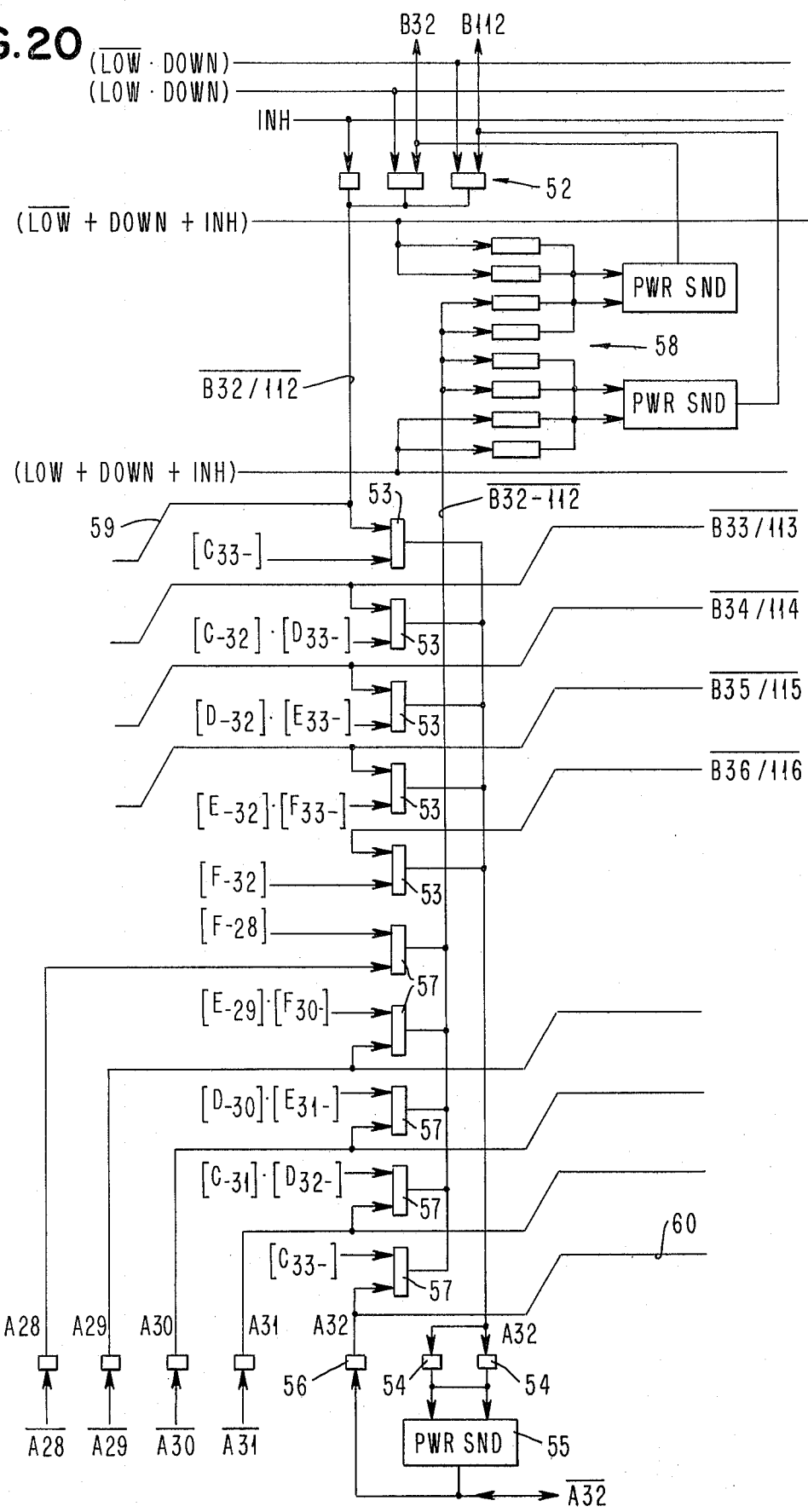
FIG. 20 shows a logic required for a bit steering utilization of a threshold decoder.

FIG. 20 shows the bidirectional steering logic for the examples (bit positions 32 or 112) discussed above. NAND gates with AND dotting are still represented by rectangles. In the B to A direction, B32 or B112 is selected in the first level of gating, noted generally at 52, by means of control signals (LOW·DOWN) and ($\overline{\text{LOW}}$·DOWN), respectively, where LOW selects B0 through B79 and $\overline{\text{LOW}}$ selects B80 through B159. The signal DOWN refers to the direction B to A. The signal INH is the abbreviated name for a chip inhibit signal which will be reflected at the output $\overline{A32}$ leaving a steering chip. The second gate level (NAND gates 53) performs the function of Equation 1 above, while the third level of gates 54 drives the output via the power send circuit 55.

In the A to B direction, $\overline{A32}$ is inverted at gate 56, then entered into the steering gate level (NAND gates 57) implementing Equation 2 above. The last level noted generally at 58 directs the steered signal into B32 by means of control signal ($\overline{\text{LOW}}$ + $\overline{\text{DOWN}}$ + INH) or into B112 by means of control signal (LOW + $\overline{\text{DOWN}}$ + INH). The first level 56 (inverter) is inserted to assure an even number of levels in the potential feedback loop B32-$\overline{A32}$-B32. A fault, which creates a feedback loop in this path, could cause oscillation if an odd number of levels were present.

The single line shown in FIG. 20 (for example $[C_{-32}] \cdot [D_{33-}]$) controlling the data input to each steering gate will actually comprise a bundle of lines after the controls shown in brackets of Equations 1 and 2, are expanded. Further, the line 59, carrying signal $\overline{B32/112}$, is applied to the steering gates 53 associated with lines A28 through A32. The line 60 carrying signals from A32 is applied to the steering gates 57 associated with lines $\overline{B32\text{-}112}$ through $\overline{B36\text{-}116}$.

The C, D, E, and F codes are decoded to produce the controls represented by the threshold functions of the bracketed expressions of Eqs. 1 and 2. The decoding is therefore threshold decoding and not the conventional address decoding.

Figure 21:
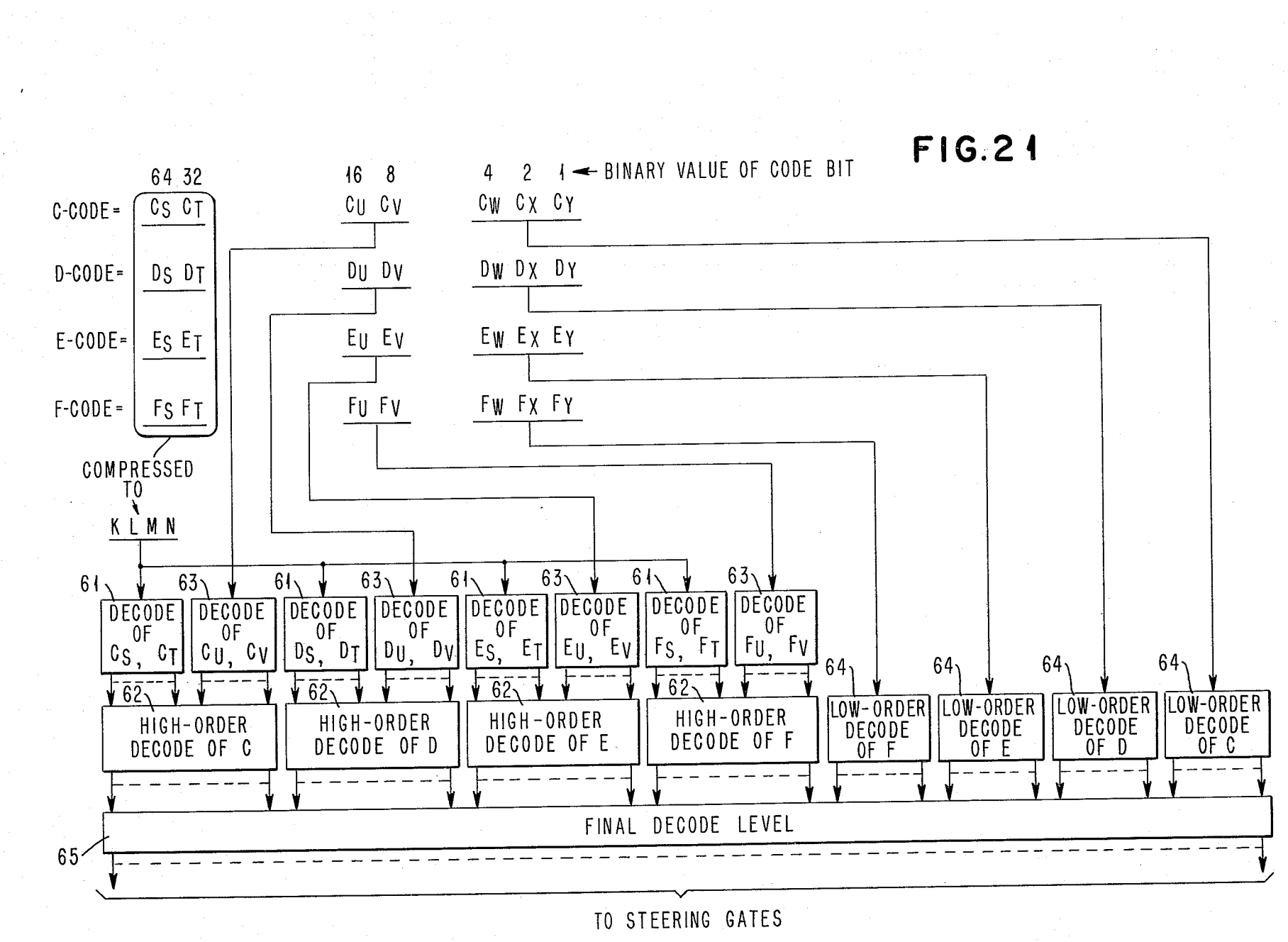

As with conventional decoding, it is more efficient to decode into threshold functions by separating the rather large number of bits of each code into two or more parts of a few bits each, decoding the parts independently, and finally combining these in one or more additional decode levels. FIGS. 21, 22, and 23 illustrate the decoding method.

FIG. 21 shows in block diagram form how the C, D, E, and F codes of TABLE VI are partitioned into smaller codes. Each of the four 7-bit codes is divided into three parts, the upper two bits with subscripts S and T, the middle two bits with subscripts U and V, and the low order three bits with subscripts W, X and Y. The upper two bits of all four codes are represented by the compressed set of four bits, K, L, M and N, according to TABLE VII. From the compressed four bits we get the threshold functions of the upper two bits of each of the four codes in logic blocks 61. These threshold functions are combined in logic 62, with the threshold functions of the middle two bits from logic 63 for each of the four codes, respectively, to produce the high-order intermediate threshold functions of each of the four codes. The low-order three bits of the respective codes are decoded by logic 64 into their respective threshold functions. The high-order and the low-order intermediate threshold functions are combined in a final decode level 65 whose outputs comprise the control signals for the steering gates, which, depending on the individual codes, may produce a plurality of threshold outputs.

FIG. 22 illustrates the low-order intermediate threshold function generator 64 of FIG. 21, for the complement as well as for the true threshold functions of code C. Similar low-order decoding is done for codes D, E, and F. The low-order threshold functions are distinguished by the added letter L following the code letter C, D, E or F.

FIG. 23 illustrates the high-order decode logic 61, 62, and 63 of FIG. 21, and the relevant inputs and intermediate outputs for code C. From the common bits, K, L, M and N, the threshold functions of multiples of 32 are generated as per equations previously given in TABLE VIII. At the same time, the middle bits are decoded into threshold functions of multiples of 8. The upper and middle threshold functions are then combined into high-order threshold functions of multiples of 8. Note the distinction made between the threshold functions of multiples of 8 derived from the middle bits along and the threshold functions of multiples of 8 derived from the full high-order decode. For example, $CM_{-7}$ include C code combinations 0 through 7, 32 through 39, 64 through 71, as well as the illegal combinations 96 through 103, whereas $C_{-7}$ includes only the combinations 0 through 7. Similar high-order decoding is done for codes D, E, and F.

The final decode level 65 of FIG. 21 combines the high-order and the low-order threshold functions. For example, the bracketted term $C_{33-}$ of Equation 2 can be expressed as a combination of high-order and low-order threshold functions either as a logical sum of products or a product of sums, as follows:

$$[C_{33-}] = C_{40-} + C_{32-} \cdot CL_{1-} = C_{32-} \cdot (C_{40-} + CL_{1-})$$

The complement threshold function, $C_{-32}$ is similarly expressed as:

$$[C_{-32}] = C_{-31} + C_{-39} \cdot CL_0 = C_{-39} \cdot (C_{-31} + CL_0)$$

Figure 24:
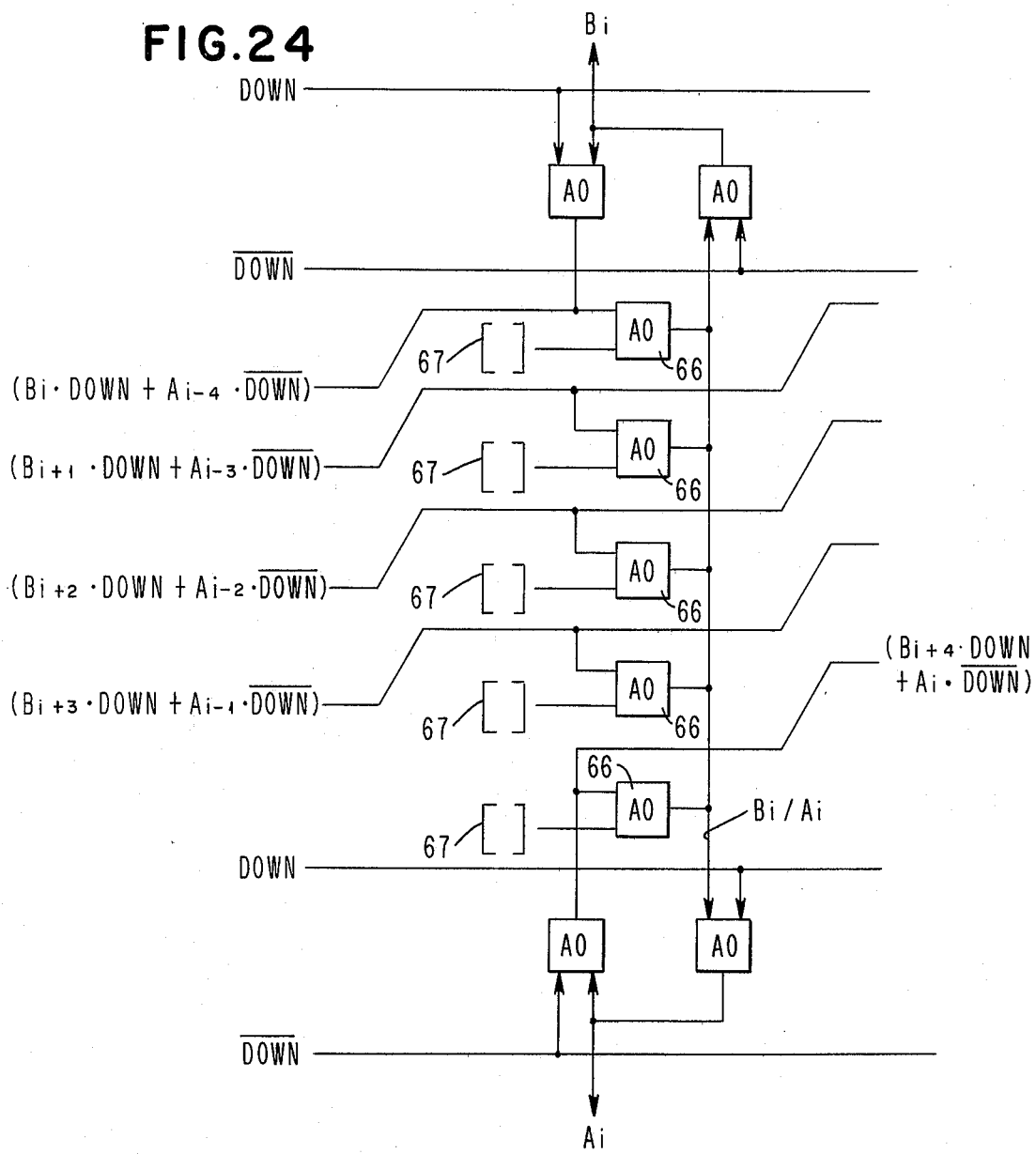
FIG. 24 shows the logic of a bit steering mechanism which is a modification of that shown in FIG. 20.

FIG. 24 shows a simplified version of the bit string logic between a generalized B-line and A-line identified as B1 and A1. Whereas the bit steering logic of FIG. 20 utilizes the previously discussed NAND/dot-AND logic, FIG. 24 shows the use of AND/dot-OR logic which permits the two sets of gates 53 and 57 of FIG. 20 to be combined into a single set of gates 66. The gates are identified by the symbol A0. In FIG. 24, one input to each of the gates 66 is an OR-DOT of a proper one of the B-lines or A-lines dependent upon whether transfer is from or to the storage device 46. The other input to each of the gates 66, represented by the bracket, such as 67, is the enabling signal created by the generalized logic equation shown in TABLE XI.

While the invention has been particularly shown and described with references to preferred embodiments thereof, it will be understood by those skilled in the art that the foregoing and other changes in form and details may be made therein without departing from the spirit and scope of the invention.

TABLE I $C_{32-} = C_{32\text{-}63} + C_{64\text{-}95} + C_{96\text{-}127} = C_S + C_T$
$C_{64-} = C_{64\text{-}95} + C_{96\text{-}127} = \overline{C}_S$
$C_{96-} = C_{96\text{-}127} = C_S \cdot C_T$
$C_{-31} = C_{0\text{-}31}$  $\quad = \overline{C}_S \overline{C}_T$
$C_{-63} = C_{0\text{-}31} + C_{32\text{-}63}$  $\quad = \overline{C}_S$
$C_{-95} = C_{0\text{-}31} + C_{32\text{-}63} + C_{64\text{-}95}$  $\quad = \overline{C}_S + \overline{C}_T$

TABLE II $CM_{8-} = CM_8 + CM_{16} + CM_{24} = C_U + C_V$
$CM_{16-} = CM_{16} + CM_{24} = C_U$
$CM_{24-} = CM_{24} = C_U \cdot C_V$
$CM_{-7} = CM_0 = \overline{C}_U \overline{C}_V$
$CM_{-15} = CM_0 + CM_8 = \overline{C}_U$
$CM_{-23} = CM_0 + CM_8 + CM_{16}$ $\quad \overline{C}_U + \overline{C}_V$

TABLE III $C_{8-} = C_{32-} + CM_{8-}$
$C_{16-} = C_{32-} + CM_{16-}$
$C_{24-} = C_{32-} + CM_{24-}$
$C_{32-} = C_{32-}$
$C_{40-} = C_{64-} + C_{32-} \cdot CM_{8-} = C_{32-} \cdot (C_{64-} + CM_{8-})$
$C_{48-} = C_{64-} + C_{32-} \cdot CM_{16-} = C_{32-} \cdot (C_{64-} + CM_{16-})$
$C_{56-} = C_{64-} + C_{32-} \cdot CM_{24-} = C_{32-} \cdot (C_{64-} + CM_{24-})$
$C_{64-} = C_{64-}$
$C_{72-} = C_{96-} + C_{64-} \cdot CM_{8-} = C_{64-} \cdot (C_{96-} + CM_{8-})$
$C_{80-} = C_{96-} + C_{64-} \cdot CM_{16-} = C_{64-} \cdot (C_{96-} + CM_{16-})$
$C_{88-} = C_{96-} + C_{64-} \cdot CM_{24-} = C_{64-} \cdot (C_{96-} + CM_{24-})$
$C_{96-} = C_{96-}$
$C_{104-} = C_{96-} \cdot CM_{8-}$
$C_{112-} = C_{96-} \cdot CM_{16-}$
$C_{120-} = C_{96-} \cdot CM_{24-}$

TABLE IV

| | |
|---|---|
| $(A \leq 0) = \overline{A0} \cdot \overline{A1} \cdot \overline{A2}$ | $(S \geq 0) = 1$ |
| $(A \leq 1) = \overline{A0} \cdot \overline{A1}$ | $(S \geq 1) = (S0 + S1 + S2)$ |
| $(A \leq 2) = \overline{A0} \cdot (\overline{A1} + \overline{A2})$ | $(S \geq 2) = S0 + S1$ |
| $(A \leq 3) = \overline{A0}$ | $(S \geq 3) = (S0 + S1) \cdot (S0 + S2)$ |
| $(A \leq 4) = (\overline{A0} + \overline{A1}) \cdot (\overline{A0} + \overline{A2})$ | $(S \geq 4) = S0$ |
| $(A \leq 5) = (\overline{A0} + \overline{A1})$ | $(S \geq 5) = S0 \cdot (S1 + S2)$ |
| $(A \leq 6) = (\overline{A0} + \overline{A1} + \overline{A2})$ | $(S \geq 6) = S0 \cdot S1$ |
| $(A \leq 7) = 1$ | $(S \geq 7) = S0 \cdot S1 \cdot S2$ |

TABLE V $$MK0 = (W1+X) \cdot [\overline{A0}+\overline{W1}] \cdot [\overline{A1}+\overline{W1}] \cdot [\overline{A2}+\overline{W1}]$$
$$MK1 = (\quad) \cdot [\quad] \cdot [\quad\downarrow\quad] \qquad\qquad\qquad \cdot [S0+S1+S2+W1\cdot X]$$
$$MK2 = (\quad) \cdot [\quad] \cdot [\overline{A1}+\overline{A2}+\overline{W1}] \qquad \cdot [S0+S1+W1\cdot X]$$
$$MK3 = (\quad) \cdot [\quad] \cdot [\quad\downarrow\quad] \qquad\qquad\qquad [\quad\downarrow\quad] \cdot [S0+S2+W1\cdot X]$$
$$MK4 = (\quad) \cdot$$
$$MK5 = (\quad) \cdot [\overline{A0}+\overline{A1}+\overline{W1}] \cdot [\overline{A0}+\overline{A2}+\overline{W1}] \cdot [S0+W1\cdot X]$$
$$MK6 = (\quad\downarrow\quad) \cdot [\quad\downarrow\quad] \cdot [\quad\downarrow\quad] \qquad\qquad [\quad\qquad] \cdot [S1+S2+W1\cdot X]$$
$$MK7 = (\quad W1 \quad) \cdot \qquad\qquad\qquad\qquad\qquad\qquad [\quad\qquad\downarrow\quad] \cdot [S2+W1\cdot X]$$

TABLE VI

|   |   | S T U V W X Y |   |
|---|---|---|---|
|   |   | 0 0 0 0 0 0 0 = 0 = B0 (B80) IS FAULTY |   |
| C |   | 0 0 0 0 0 0 1 = 1 = B1 (B81) IS FAULTY |   |
| 7-BIT CODE |   | \| \| |   |
| OF 1ST |   | \| \| |   |
| FAULTY LINE |   | \| \| |   |
|   |   | 1 0 0 1 1 1 1 = 79 = B79 (B159) IS FAULTY |   |
|   |   | 1 0 1 0 0 0 0 = 80 = NO FAULTY LINE |   |
|   |   | 1 0 1 0 0 0 1 = 81 = |   |
|   |   | \| \| ⎫ |   |
|   |   | \| \| ⎬ ILLEGAL |   |
|   |   | 1 1 1 1 1 1 1 = 127 = ⎭ |   |
|   |   | 0 0 0 0 0 0 0 = 0 = B1(B81) IS 2ND FAULTY LINE |   |
| D |   | 0 0 0 0 0 0 1 = 1 = B2 (B82) IS 2ND FAULTY LINE |   |
| 7-BIT CODE |   | \| \| | IF D≧C; |
| OF 2ND |   | \| \| | OTHERWISE |
| FAULTY LINE |   | \| \| | D IS ILLEGAL |
|   |   | 1 0 0 1 1 1 0 = 78 = B79 (B159) IS 2ND FAULTY LINE |   |
|   |   | 1 0 0 1 1 1 1 = 79 = NO 2ND FAULTY LINE |   |
|   |   | 1 0 1 0 0 0 0 = 80 = |   |
|   |   | \| \| ⎫ |   |
|   |   | \| \| ⎬ ILLEGAL |   |
|   |   | 1 1 1 1 1 1 1 = 127 = ⎭ |   |
|   |   | 0 0 0 0 0 0 0 = 0 = B2 (B82) IS 3RD FAULTY LINE |   |
| E |   | 0 0 0 0 0 0 1 = 1 = B3 (B83) IS 3RD FAULTY LINE |   |
| 7-BIT CODE |   | \| \| | IF E≧D; |
| OF 3RD |   | \| \| | OTHERWISE |
| FAULTY LINE |   | \| \| | E IS ILLEGAL |
|   |   | 1 0 0 1 1 0 1 = 77 = B79(B159) IS 3RD FAULTY LINE |   |
|   |   | 1 0 0 1 1 1 0 = 78 = NO 3RD FAULTY LINE |   |
|   |   | 1 0 0 1 1 1 1 = 79 = |   |
|   |   | \| \| ⎫ |   |
|   |   | \| \| ⎬ ILLEGAL |   |
|   |   | 1 1 1 1 1 1 1 = 127 = ⎭ |   |
|   |   | 0 0 0 0 0 0 0 = 0 = B3 (B83) IS 4TH FAULTY LINE |   |
| F |   | 0 0 0 0 0 0 1 = 1 = B4 (B84) IS 4TH FAULTY LINE |   |
| 7-BIT CODE |   | \| \| | IF F≧E; |
| OF 4TH |   | \| \| | OTHERWISE |
| FAULTY LINE |   | \| \| | F IS ILLEGAL |
|   |   | 1 0 0 1 1 0 0 = 76 = B79 (B159) IS 4TH FAULTY line |   |
|   |   | 1 0 0 1 1 0 1 = 77 = NO 4TH FAULTY LINE |   |
|   |   | 1 0 0 1 1 1 0 = 78 = |   |
|   |   | \| \| ⎫ |   |
|   |   | \| \| ⎬ ILLEGAL |   |
|   |   | 1 1 1 1 1 1 1 = 127 = ⎭ |   |

TABLE VII

| 8-BIT CODE | | | | → | 4-BIT CODE | | | |
|---|---|---|---|---|---|---|---|---|
| $(C_S C_T)$ | $(D_S D_T)$ | $(E_S E_T)$ | $(F_S F_T)$ | | K | L | M | N |
| $(00=C_{-31})$ | $(00=D_{-31})$ | $(00=E_{-31})$ | $(00=F_{-31})$ | → | 0 | 0 | 0 | 0 |
| ↓ | ↓ | ↓ | $(01=F_{32-63})$ | → | 0 | 0 | 0 | 1 |
| | | | $(10=F_{64-})$ | → | 0 | 0 | 1 | 0 |
| | | $(01=E_{32-63})$ | $(01=F_{32-63})$ | → | 0 | 0 | 1 | 1 |
| | | | $(10=F_{64-})$ | → | 0 | 1 | 0 | 0 |
| | | | | → | 0 | 1 | 0 | 1 |
| | | $(10=E_{64-})$ | | → | 0 | 1 | 1 | 0 |
| | $(01=D_{32-63})$ | $(01=E_{32-63})$ | $(01=F_{32-63})$ | → | 0 | 1 | 1 | 1 |
| | | | $(10=F_{64-})$ | → | 1 | 0 | 0 | 0 |
| | | $(10=E_{64-})$ | | → | 1 | 0 | 0 | 1 |
| | $(10=D_{64-})$ | | | → | 1 | 0 | 1 | 0 |
| $(01=C_{32-63})$ | $(01=D_{32-63})$ | $(01=E_{32-63})$ | $(01=F_{32-63})$ | → | 1 | 0 | 1 | 1 |
| | | | $(10=F_{64-})$ | → | 1 | 1 | 0 | 0 |
| | | $(10=E_{64-})$ | | → | 1 | 1 | 0 | 1 |
| | $(10=D_{64-})$ | | | → | 1 | 1 | 1 | 0 |
| $(10=C_{64-})$ | | | ILLEGAL | → | 1 | 1 | 1 | 1 |

TABLE VIII $C_{-31} = \overline{K} + \overline{L} \cdot M$  $\quad C_{32-} = K \cdot (L+M)$  $\quad = \overline{C_{-31}}$ $C_{-63} = \overline{K} + \overline{L} + \overline{M}$  $\quad C_{64-} = K \cdot L \cdot M$  $\quad = \overline{C_{-63}}$ $D_{-31} = \overline{K} \cdot (\overline{L} + \overline{M})$  $\quad D_{32-} = K + L \cdot M$  $\quad = \overline{D_{-31}}$ $D_{-63} = \overline{(K \cdot L \cdot M)} \cdot (\overline{K} + \overline{N} + M)$  $\quad D_{64-} = K \cdot L \cdot M + K \cdot N \cdot \overline{M}$  $\quad = \overline{D_{-63}}$ $E_{-31} = \overline{K} \cdot \overline{L} \cdot (\overline{M} + \overline{N})$  $\quad E_{32-} = K + L + M \cdot N$  $\quad = \overline{E_{-31}}$ $E_{-63} = (\overline{K} + \overline{L}) \cdot M + \overline{K} \cdot (\overline{L} + \overline{N})$  $\quad E_{64-} = K \cdot L + K \cdot \overline{M} + L \cdot \overline{M} \cdot N$  $\quad = \overline{E_{-63}}$ $F_{-31} = \overline{K} \cdot \overline{L} \cdot \overline{M} \cdot \overline{N}$  $\quad F_{32-} = K + L + M + N$  $\quad = \overline{F_{-31}}$ $F_{-63} = \overline{K} \cdot \overline{L} \cdot (\overline{M} + \overline{N}) + (\overline{K} \cdot L + K \cdot \overline{L}) \cdot M \cdot N$  $\quad F_{64-} = K \cdot L + (K+L) \cdot (M+N) + \overline{K} \cdot \overline{L} \cdot M \cdot N$  $\quad = \overline{F_{-63}}$

TABLE IX $\overline{A0} = \overline{B0/80} \cdot [C_{1-}] + \overline{B1/81} \cdot [C_0 \cdot D_{1-}] + \overline{B2/82} \cdot [D_0 \cdot E_{1-}] + \overline{B3/83} \cdot [E_0 \cdot F_{1-}] + \overline{B4/84} \cdot [F_0]$ $\overline{A1} = \overline{B1/81} \cdot [C_{2-}] + \overline{B2/82} \cdot [C_{-1} \cdot D_{2-}] + \overline{B3/83} \cdot [D_{-1} \cdot E_{2-}] + \overline{B4/84} \cdot [E_{-1} \cdot F_{2-}] + \overline{B5/85} \cdot [F_{-1}]$ $\overline{A74} = \overline{B74/154} \cdot [C_{75-}] + \overline{B75/155} \cdot [C_{-74} \cdot D_{75-}] + \overline{B76/156} \cdot [D_{-74} \cdot E_{75-}] + \overline{B77/157} \cdot [E_{-74} \cdot F_{75-}] + \overline{B78/158} \cdot [F_{-74}]$ $\overline{A75} = \overline{B75/155} \cdot [C_{76-}] + \overline{B76/156} \cdot [C_{-75} \cdot D_{76-}] + \overline{B77/157} \cdot [D_{-75} \cdot E_{76-}] + \overline{B78/158} \cdot [E_{-75} \cdot F_{76-}] + \overline{B79/159} \cdot [F_{-75}]$

TABLE X $B0\text{-}80 = A0 \cdot [C_{1-}]$
$B1\text{-}81 = A1 \cdot [C_{2-}] + A0 \cdot [C_0 \cdot D_{1-}]$
$B2\text{-}82 = A2 \cdot [C_{3-}] + A1 \cdot [C_{-1} \cdot D_{2-}] + A0 \cdot [D_0 \cdot E_{1-}]$
$B3\text{-}83 = A3 \cdot [C_{4-}] + A2 \cdot [C_{-2} \cdot D_{3-}] + A1 \cdot [D_{-1} \cdot E_{2-}] + A0 \cdot [E_0 \cdot F_{1-}]$
$B4\text{-}84 = A4 \cdot [C_{5-}] + A3 \cdot [C_{-3} \cdot D_{4-}] + A2 \cdot [D_{-2} \cdot E_{3-}] + A1 \cdot [E_{-1} \cdot F_{2-}] + A0 \cdot [F_0]$ $B75\text{-}155 = A75 \cdot [C_{76-}] + A74 \cdot [C_{-74} \cdot D_{75-}] + A73 \cdot [D_{-73} \cdot E_{74-}] + A72 \cdot [E_{-72} \cdot F_{73-}] + A71 \cdot [F_{-71}]$
$B76\text{-}156 = \qquad A75 \cdot [C_{-75} \cdot D_{76-}] + A74 \cdot [D_{-74} \cdot E_{75-}] + A73 \cdot [E_{-73} \cdot F_{74-}] + A72 \cdot [F_{-72}]$
$B77\text{-}157 = \qquad\qquad A75 \cdot [D_{-75} \cdot E_{76-}] + A74 \cdot [E_{-74} \cdot F_{75-}] + A73 \cdot [F_{-73}]$
$B78\text{-}158 = \qquad\qquad\qquad A75 \cdot [E_{-75} \cdot F_{76-}] + A74 \cdot [F_{-74}]$
$B79\text{-}159 = \qquad\qquad\qquad\qquad A75 \cdot [F_{-75}]$

TABLE XI $$Bi/Ai = (Bi \cdot DOWN + Ai-4 \cdot \overline{DOWN}) \cdot [DOWN \cdot \begin{matrix} C_{(i+1)-} \\ \cdot C_{-i} \cdot D_{(i+1)-} \\ \cdot D_{-i} \cdot E_{(i+1)-} \\ \cdot E_{-i} \cdot F_{(i+1)-} \\ \cdot E_{-i} \end{matrix} + \overset{\downarrow Ai}{\overline{DOWN}} \cdot \begin{matrix} F_{-(i-4)} \\ \cdot E_{-(i-3)} \cdot F_{(i-2)-} \\ \cdot D_{-(i-2)} \cdot E_{(i-1)-} \\ \cdot C_{-(i-1)} \cdot D_i \\ \cdot \overline{C_{(i+1)-}} \end{matrix}]$$

$$+ \begin{matrix}(Bi+1 \cdot \\ (Bi+2 \cdot \\ (Bi+3 \cdot \\ (Bi+4 \cdot \end{matrix} \begin{matrix} +Ai-3 \cdot \\ +Ai-2 \cdot \\ +Ai-1 \cdot \\ +Ai \quad \cdot \end{matrix}$$

What is claimed is:

1. Binary data handling apparatus comprising: $n$ input signal lines comprised of, $p$ signal lines receiving the high order binary-weighted code signals, and $q$ signal lines receiving the low-order binary-weighted code signals;

$m$ output signal lines, each output signal line being associated with a value represented by the binary coding received by said $n$ input signal line, a threshold generator connected, and responsive to, said $n$ input signal lines, and including a final logic level of $m$ logic circuit means connected, and providing binary signals to, said $m$ output signal lines, whereby at least one threshold, related to the coded value on said $n$ input signal lines is manifested by those of said $m$ output signal lines on one side of the threshold having one binary condition, and those of said $m$ output signal lines on the other side of the threshold having the other binary condition, said threshold generator further comprising, a first intermediate threshold generator having $2^p-1$ intermediate output signal lines connected and responsive to, said $p$ signal lines for generating a first intermediate threshold output signal, a second intermediate threshold generator having $2^q-1$ intermediate output signal lines, connected and responsive to, said $q$ signal lines for generating a second intermediate threshold output signal, and said final level of said threshold generator is comprised of, $2^n-1$ logic circuit means, connected and responsive to said first and second intermediate output signal lines of said first and said second intermediate threshold generators.

2. Binary data handling apparatus in accordance with claim 1 wherein:

said $n$ input signal lines are comprised of, first and second groups of signal lines receiving binary-weighted code signals; and said threshold generator is comprised of, a first intermediate threshold generator having intermediate output signal lines, connected and responsive to said first and second groups of signal lines for generating a first intermediate threshold output signal, said first intermediate threshold generator also having a further logic signal output, a second intermediate threshold generator having intermediate output signal lines, connected and responsive to, said second group of signal lines and said further logic signal output from said first intermediate threshold generator for generating a second intermediate threshold output signal, and $m$ logic circuit means, connected between said first and second intermediate threshold output signal lines and said $m$ output signal lines, whereby at least one threshold related to the coded value on said second group of input signal lines is manifested, and a second threshold is conditionally manifested dependent upon the coded value on said first group of input signal lines.

3. Binary data handling apparatus in accordance with claim 2 wherein:

said first intermediate threshold generator is further comprised of, a parallel binary adder receiving said first and second groups of signal lines and having output means manifesting the sum of said first and second binary-weighted code signals, said further logic signal output manifesting a high order binary carry out of said parallel binary adder, a plurality of sum and carry combining means, connected and responsive to, said parallel binary adder sum output and carry out, for generating said first intermediate threshold output signal; and said second intermediate threshold generator is comprised of, a plurality of further combining means connected and responsive to said second group of signal lines and said parallel binary adder carry out.

4. Binary data handling apparatus in accordance with claim 3 which further includes:

a cycle signalling line, said line manifesting a first or second binary state dependent on whether the coded signals on said first and second groups of signal lines are being utilized to generate said threshold on said $m$ output signal lines during a first or second cycle of operation, and means connecting said cycle signalling line to said sum and carry combining means and said further combining means.

5. Binary data handling apparatus in accordance with claim 1 wherein:

said plurality of groups of input signal lines includes, a first plurality of groups of input signal lines, each receiving independent coded, binary-weighted values, and a further one of said groups of input signal lines receiving a coded, binary-weighted value related to the independent coded values; and said threshold generator is comprised of, a first plurality of intermediate threshold generators having intermediate output signal lines, each connected and responsive to, a first sub-group of said input signal lines of a corresponding one of said first plurality of groups of input signal lines, a second plurality of intermediate threshold generators having intermediate output signal lines, each connected and responsive to, a second sub-group of a corresponding one of said first plurality of groups of input signal lines, and said further group of said input signal lines; and a final level of logic circuit means, connected and responsive to, said intermediate output signal lines of said first and second intermediate threshold generators, for generating at least one threshold on said $m$ output signal lines.

6. Binary data handling apparatus in accordance with claim 5 wherein:

each said first sub-group of input signal lines manifest low-order binary bits of a coded weighted value, each said second sub-group of input signal lines manifest middle-order binary bits of a coded-weighted value, and said further one of said groups of input signal lines manifests a binary re-coding of high-order binary bits of all of the coded weighted values of said independent coded, binary-weighted values.

* * * * *